(12) United States Patent
Rinerson et al.

(10) Patent No.: US 8,268,667 B2
(45) Date of Patent: Sep. 18, 2012

(54) MEMORY DEVICE USING ION IMPLANT ISOLATED CONDUCTIVE METAL OXIDE

(75) Inventors: Darrell Rinerson, Cupertino, CA (US); Robin Cheung, Cupertino, CA (US); David Hansen, Palo Alto, CA (US); Steven Longcor, Mountain View, CA (US); Rene Meyer, Atherton, CA (US); Jonathan Bornstein, Cupertino, CA (US); Lawrence Schloss, Palo Alto, CA (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 13/215,895

(22) Filed: Aug. 23, 2011

(65) Prior Publication Data

US 2011/0315948 A1    Dec. 29, 2011

Related U.S. Application Data

(63) Continuation of application No. 12/653,851, filed on Dec. 18, 2009, now Pat. No. 8,003,511.

(60) Provisional application No. 61/203,912, filed on Dec. 19, 2008, provisional application No. 61/203,163, filed on Dec. 19, 2008, provisional application No. 61/203,187, filed on Dec. 19, 2008, provisional application No. 61/203,189, filed on Dec. 19, 2008.

(51) Int. Cl.
*H01L 21/00* (2006.01)

(52) U.S. Cl. .......................................................... 438/104
(58) Field of Classification Search ........................ None
See application file for complete search history.

(56) References Cited

U.S. PATENT DOCUMENTS

| 8,045,364 B2 * | 10/2011 | Schloss et al. | 365/148 |
| 2009/0231906 A1 * | 9/2009 | Rinerson et al. | 365/151 |

* cited by examiner

*Primary Examiner* — Scott B Geyer
(74) *Attorney, Agent, or Firm* — Stolowitz Ford Cowger LLP

(57) ABSTRACT

Memory cell formation using ion implant isolated conductive metal oxide is disclosed, including forming a bottom electrode below unetched conductive metal oxide layer(s), forming the unetched conductive metal oxide layer(s) including depositing at least one layer of a conductive metal oxide (CMO) material (e.g., $PrCaMnO_x$, $LaSrCoO_x$, $LaNiO_x$, etc.) over the bottom electrode. At least one portion of the layer of CMO is configured to act as a memory element without etching, and performing ion implantation on portions of the layer(s) of CMO to create insulating metal oxide (IMO) regions in the layer(s) of CMO. The IMO regions are positioned adjacent to electrically conductive CMO regions in the unetched layer(s) of CMO and the electrically conductive CMO regions are disposed above and in contact with the bottom electrode and form memory elements operative to store non-volatile data as a plurality of conductivity profiles (e.g., resistive states indicative of stored data).

25 Claims, 27 Drawing Sheets

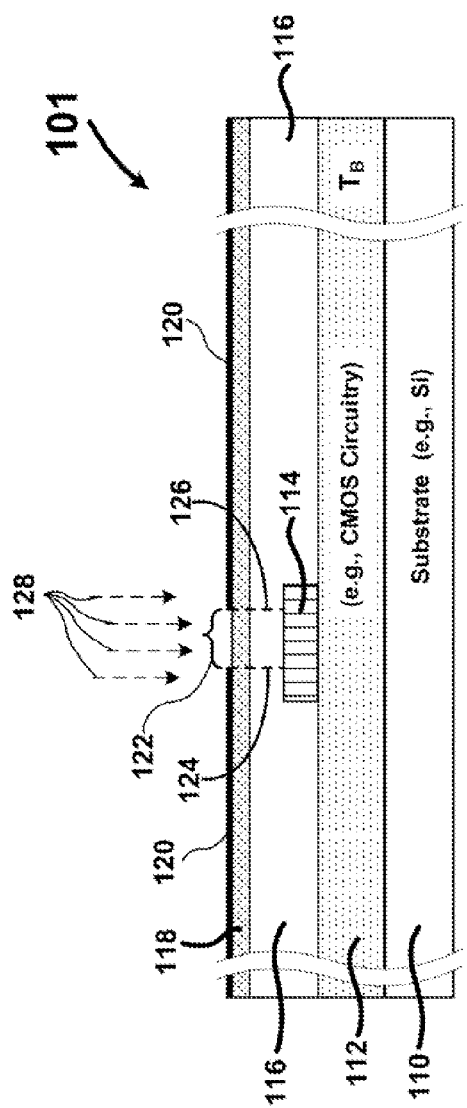
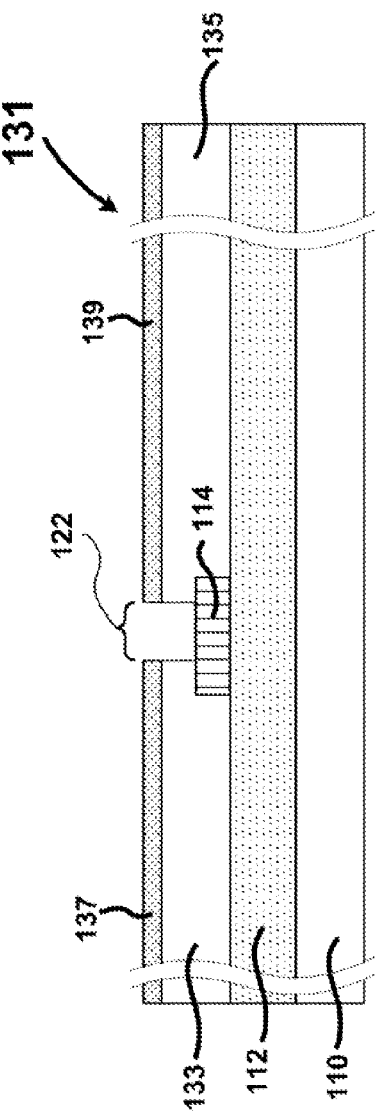
FIG. 1A
FIG. 1B

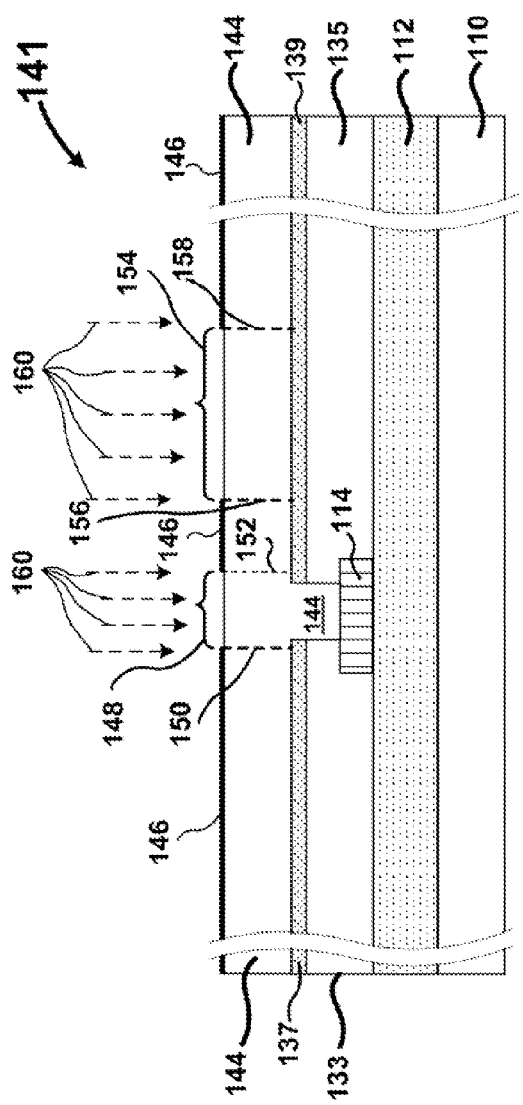
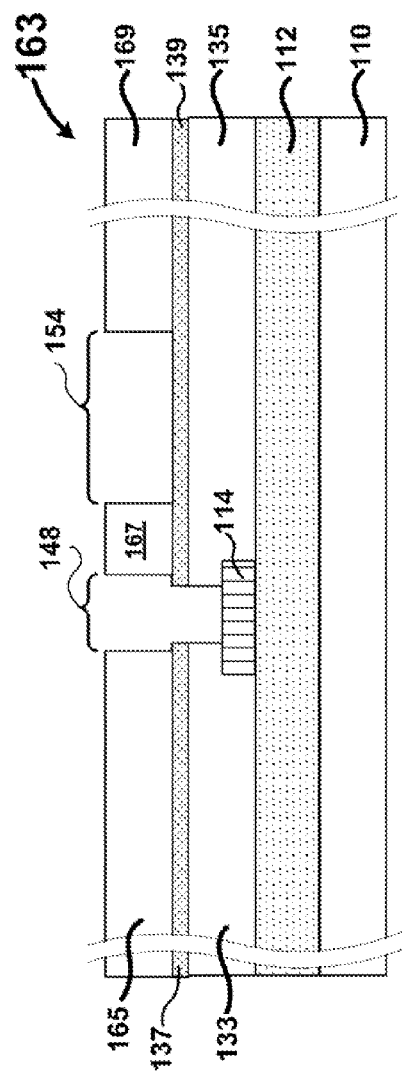
FIG. 1C
FIG. 1D

MEMORY DEVICE USING ION IMPLANT ISOLATED CONDUCTIVE METAL OXIDE

FIELD OF THE INVENTION

The present invention relates generally to microelectronics fabrication. More specifically, the present invention relates to fabrication of conductive metal oxide memory devices.

BACKGROUND

Semiconductor memories may be formed and fabricated using various materials, such as silicon oxide ($SiO_2$), noble metals, conductive metal oxide, and others. Conventional fabrication techniques for semiconductor-type memories typically use deposition of thin film materials on substrates (e.g., a silicon wafer), which are subsequently etched away ("etched") using different types of chemical and/or mechanical etching procedures and etchants. However, conventional techniques may be problematic for some types of memory devices.

Conventionally, a memory cell, including its electrodes and one or more layers of memory material that are positioned between the electrodes are etched as a stack. For example, a set of vertically configured layers of material are formed and etched to provide the memory material(s) that allows for data to be stored or retrieved based on how voltages are applied across the memory material causing a change in conductivity in the memory material that is indicative of stored data (e.g., a plurality of resistive states). However, etching a memory material, such as a layer of conductive metal oxide, may cause degradation of functional properties of the memory material. For example, some memory devices with etched memory material typically experience reduced current flow through the memory cells. There is an inverse relation between the size of a memory cell and the level of degradation of some functional properties of the memory cell. Further, poor fabrication techniques may cause detrimental effects such as a "picture frame effect" where materials can attach to surfaces, resulting in defects that can degrade performance or altogether destroy the electrically conductive properties of a fabricated memory. As a result, device yield is reduced and manufacturing costs are increased. As semiconductor feature size and memory cell size continue to decrease, the degradation of functional properties continues to increase.

There are continuing efforts to improve methods for fabricating memory devices.

BRIEF DESCRIPTION OF THE DRAWINGS

Various examples are disclosed in the following detailed description and the accompanying drawings.

FIG. 1A is a cross-sectional view of an exemplary wafer undergoing an exemplary etch;

FIG. 1B is a cross-sectional view of an exemplary wafer after etching has been performed;

FIG. 1C is a cross-sectional view of an exemplary wafer undergoing another exemplary etch;

FIG. 1D is a cross-sectional view of an exemplary wafer after etching has been performed;

Figure 1E:
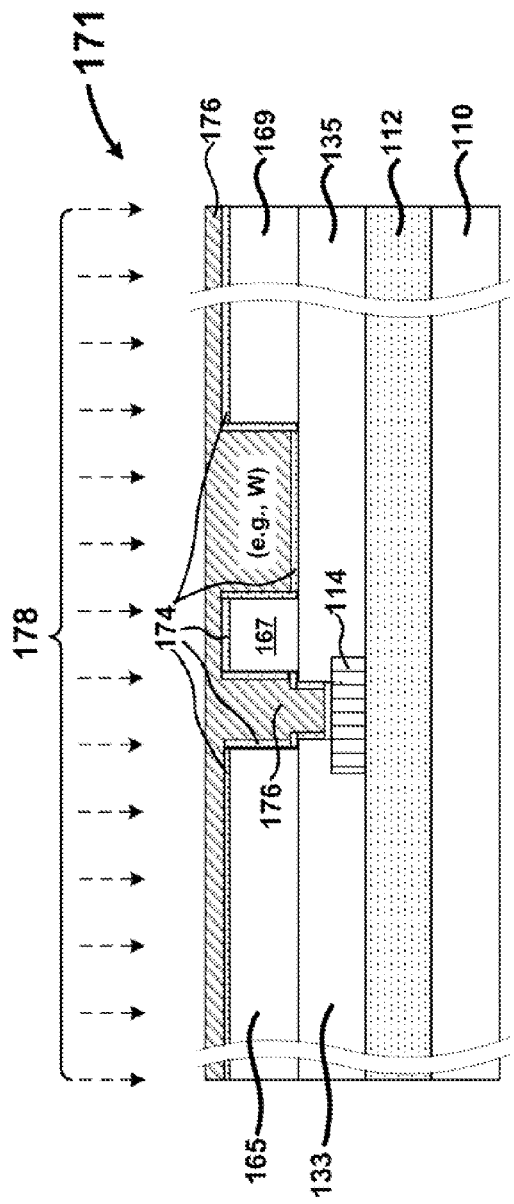
FIG. 1E is a cross-sectional view of an exemplary wafer after additional material has been deposited.

Although the previous drawings depict various examples of the invention, the invention is not limited by the depicted examples. Furthermore, the depictions are not necessarily to scale.

DETAILED DESCRIPTION

Various embodiments or examples may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

In some examples, techniques such as those described herein enable emulation of multiple memory types for implementation on a single component such as a wafer, substrate, or die. U.S. patent application Ser. No. 11/095,026, filed Mar. 30, 2005, now Published U.S. Application No. 2006/0171200, and entitled "Memory Using Mixed Valence Conductive Oxides," is hereby incorporated by reference in its entirety for all purposes and describes non-volatile third dimensional memory elements that may be arranged in a two-terminal, cross-point memory array. New memory structures are possible with the capability of this third dimensional memory array. The technology allows for the emulation of other memory technologies by duplicating the interface signals and protocols, while accessing the third dimensional memory array. The third dimensional memory array may emulate other types of memory (e.g., emulation of DRAM, SRAM, ROM, EEPROM, and FLASH), providing memory combinations within a single component.

Semiconductor memories and memory material may be fabricated using the described techniques to create a single-layer or multiple-layer three-terminal memory and a single-layer or multiple-layer two-terminal memory, such as a cross-point memory described in U.S. patent application Ser. No. 11/095,026 (incorporated above). Using materials including but not limited to silicon oxide ($SiO_2$), platinum (Pt), titanium nitride (TiN), yttria-stabilized zirconia (YSZ), tungsten (W), conductive metal oxide (CMO), perovskites, and others, a memory may be formed with at least one layer of continuous and unetched memory material sandwiched between two or more electrodes. As part of the formation of a memory cell, for example, a discrete bottom electrode of a memory cell may be formed by etching one or more layers of material. The etched layers may be filled with material and planarized. Above the bottom electrode, one or more layers of memory material may be deposited but not etched (i.e., continuous, unetched layers of memory material). Above the unetched layer(s) of memory material (e.g., the uppermost layer of continuous and unetched memory material), additional layers of material, including a material for a top electrode, and optionally a non-ohmic device (NOD) may be deposited and etched to form an implantation mask that, when implanted using ion implantation techniques, creates an insulating layer of conductive metal oxide (CMO) (e.g., praseodymium calcium manganese oxide—PCMO) in regions of the CMO that are not covered by the implantation mask. The implantation mask may or may not include the NOD, that is, the NOD may be formed after the layers that comprise the implantation mask. The continuous and unetched layer(s) of CMO may include perovskite-based structures and materials (e.g., PCMO) that, when exposed to argon (Ar), xenon (Xe), titanium (Ti), zirconium (Zr), aluminum (Al), silicon (Si), oxygen ($O_2$), silicon and oxygen, or other types of ion implantation techniques and materials, creates regions of material that are electrically insulating and may be referred to as insulating metal oxide (IMO). Depending on the type of CMO material selected, its thickness, and processing conditions, the IMO regions can have an amorphous structure that is electrically insulating or a crystalline structure that is electrically insulating. The described techniques enables the formation of memories with small feature sizes and matrices of top and bottom electrodes that are electrically insulated from one another with a greater degree of fabrication reliability and decreased defect or degradation rates. The described fabrication techniques may be varied and are not limited to the examples provided.

FIG. 1A is a cross-sectional view of an exemplary wafer undergoing an exemplary etch. Here wafer 101 is shown with a substrate 110 (e.g., a silicon—Si wafer), layer 112 (e.g., CMOS circuitry fabricated on substrate 110), interconnecting material layer 114 (e.g., copper—Cu), dielectric material layer 116 (e.g., silicon oxide—$SiO_x$), etch stop layer 118 (e.g., a dielectric material such as silicon nitride—$SiN_x$), and mask layer 120. Mask layer 120 (or mask 120) includes a pattern of, for example, a hole 122 indicated by lines 124 and 126 in a cross-sectional view. Wafer 101 is shown being etched using etchant 128. As used herein, layers of chemical compounds (e.g., CMOS layer 112, interconnecting material layer 114, layer 116, etch stop layer 118, and mask layer 120) may also be referred to as "layers," "materials," or by chemical compound names or formulae. Chemical compounds of one or more layers may be different than those shown. Layer 112 may be fabricated on the substrate 110 using processing techniques that are well understood in the microelectronics art. The layer 112 includes active circuitry (e.g., drivers, address decoders, sense amps, buffers, registers, I/V converters, current mirrors, comparators, counters, voltage sources for data operations, etc.), some or all of which may be used to perform data operations on one or more layers of memory that are fabricated above the active circuitry in the layer 112. The interconnecting material layer 114 is positioned between the layer 112 and the one or more layers of memory and is operative to electrically couple at least a portion of the active circuitry with the one or more layers of memory. In some examples, the size, thickness, volume, area, composition, and quantity of material shown in FIG. 1A and other figures herein may be varied and are not limited to any specific width, thickness, dimension, volume, or other aspects. Drawings and figures are not drawn to scale (e.g., features within drawings are not drawn to scale with respect to one another).

Referring back to FIG. 1A, layers 110-120 may be deposited on substrate 110 using a variety of deposition techniques including but not limited to physical vapor deposition (PVD), sputtering, reactive sputtering, co-sputtering, chemical vapor deposition (CVD), atomic layer deposition (ALD) or other methods (collectively, "deposition methods"). One or more layers (e.g., layers 114-118) may be partially etched away using a mask pattern, such as mask 120. Patterns in a mask layer (e.g., layer 120) may be formed using, for example, photolithography technologies. In some examples, a mask (e.g., mask 120) may be a photoresist layer including photoresist material (e.g., a light-sensitive chemical) used to form a pattern for etching. Here, mask 120 includes a pattern that forms a hole or aperture 122 that exposes a surface of an underlying layer, which may be etched (e.g., plasma etched) using etchant 128. The etchant may be any material effective for etching the material(s) of the underlying layer(s) (e.g., a fluorocarbon gas effective for etching $SiN_x$ and/or $SiO_x$). As a result, the etching may form a via, a trench, or the like, that extends downward through one or more underlying layers of material. Etching may be stopped at the layer 114. For example, the material of layer 114 may function as an etch stop (e.g., chemically impeding further etching) for a selected etchant 128. In some examples, mask layer 120 may be stripped away, using techniques such as ashing or stripping (e.g., wet and dry stripping), after it is no longer needed (e.g., after etching through the hole 122).

FIG. 1B is a cross-sectional view of an exemplary wafer after etching has been performed. In figures herein, layers that have been etched are shown as "broken" layers or partial layers. Here, wafer 131 shows layers 116 and 118 (see FIG. 1A), which have been etched to create hole 122, as "broken" layers. For example layer 116 (see FIG. 1A) has been "broken" into partial layers 133 and 135 and layer 118 (see FIG. 1A) has been "broken" into partial layers 137 and 139. It should be noted that the figures herein, especially where cross-sectional views are shown, do not show the depth dimension. In some examples, the above-described wafers, elements, and processes may be varied in material, dimensions, configuration, implementation, and or aspects and are not limited to those shown and described.

FIG. 1C is a cross-sectional view of an exemplary wafer undergoing another exemplary etch. Here, wafer 141 is shown having layer 144 of, for example, $SiO_2$ deposited onto layers 137 and 139 (see FIG. 1B) using one or more deposition methods. A mask layer 146 may be patterned (e.g., using photolithography and a photoresist material) with holes 148 and 154. Hole 148 may be a via indicated by lines 150 and 152 in a cross-sectional view. Hole 154 may be a trench indicated by lines 156 and 158 in a cross-sectional view. Here, etchant 160 may be applied to etch away materials for the hole 148 and the trench 154. Etchant 160 may be a fluorocarbon gas or any etchant that is effective on etching the material for layer 144 (e.g., $SiO_2$). The etching with etchant 160 may be stopped by an etch stop material (e.g., SiN) in partial layers 137-139 and interconnecting material 114. In some examples, mask layer 144 may be stripped after it is no longer needed (e.g., after etching holes 148 and 154). For clarity, etch stop material 137-139 may not be shown in subsequent figures to avoid unnecessarily obscuring the figures.

FIG. 1D is a cross-sectional view of an exemplary wafer after etching has been performed. Here, wafer 163 shows layer 144 (see FIG. 1C), which has been etched to create holes 148 and 154, as partial layers 165-169. It should be noted that, after etching, hole 122 (see FIG. 1B) and hole 148 are collectively referred to as hole 148. In some examples, the above-described wafers, elements, and processes may be varied in material, dimensions, configuration, implementation, and or aspects and are not limited to those shown and described.

FIG. 1E is a cross-sectional view of an exemplary wafer after additional material has been deposited. Here, wafer 171 is shown having materials 174 and 176 deposited onto wafer 163 (see FIG. 1D) using one or more deposition methods. Material 174 (e.g., titanium—Ti, titanium nitride—TiN, titanium aluminum nitride—TiAlN, titanium silicon nitride—TiSiN, titanium tungsten—TiW, tantalum nitride—TaN, tantalum aluminum nitride—TaAlN, tantalum silicon nitride—TaSiN, or other) may be used as a "glue" layer to promote bonding with other materials deposited, to be deposited, or both. Material 176 may be a metal (e.g., tungsten—W, copper—Cu, aluminum—Al). Here, material 176 is deposited to cover holes 148 and 154. Excess material 176 may be removed using, for example, chemical-mechanical planarization (CMP) or some other method as applied in the approximate direction 178.

Figure 1F:
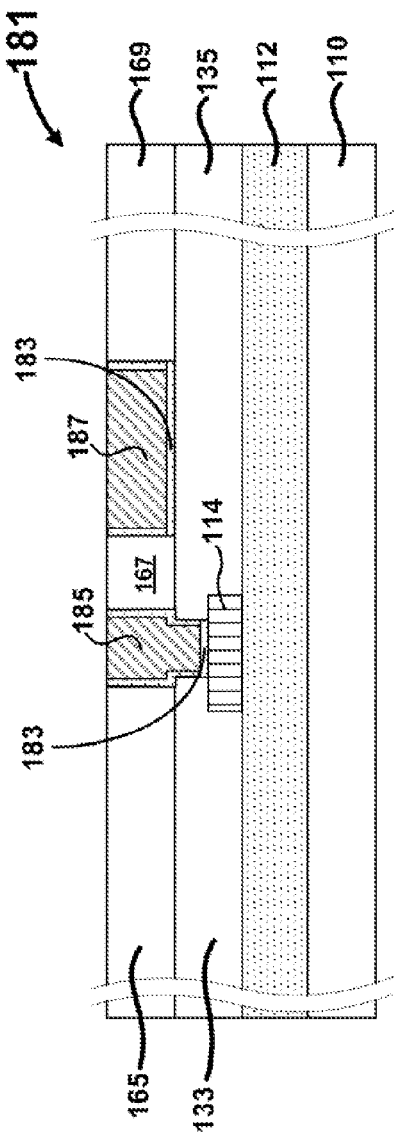
FIG. 1F is a cross-sectional view of an exemplary wafer after planarization has been performed.

FIG. 1F is a cross-sectional view of an exemplary wafer after planarization has been performed. Here, wafer 181 is shown after material 174 and 176 (see FIG. 1E) having been planarized leaving glue layer 183 and metal (e.g., tungsten—W) 185 and 187. In some examples, material on wafer 181 (e.g., materials 110-187) may be referred to as sub-regions or sub-layers. Collectively, materials 112-135 or 112-169 may be referred to as a logic layer. For clarity, glue layer 183 may not be shown in subsequent figures to avoid unnecessarily obscuring the figures. In some examples, the above-described wafers, elements, and processes may be varied in material, dimensions, configuration, implementation, and or aspects and are not limited to those shown and described.

Figure 2A:
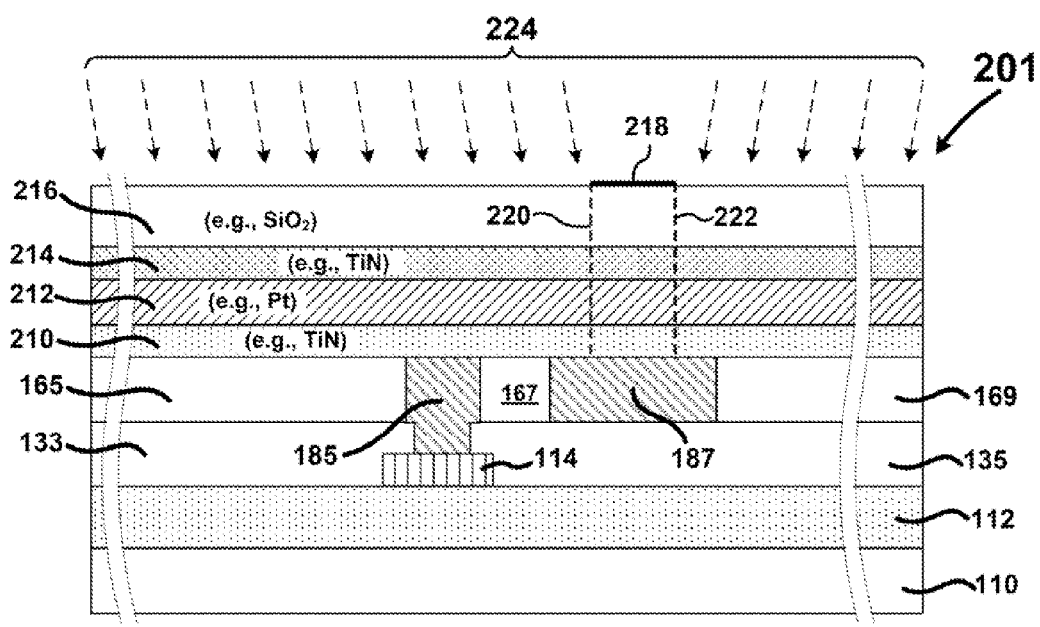
FIG. 2A is a cross-sectional view of an exemplary wafer after additional material has been deposited.

FIG. 2A is a cross-sectional view of an exemplary wafer after additional layers of material have been deposited. Here, wafer 201 is shown after layers 210-218 have been deposited on, for example, wafer 181 (see FIG. 1F) using one or more deposition methods. Layers 210-218 may be deposited to form electrodes of memory cells. Lines 220 and 222 show, for example, cross-sectional boundaries of an electrode to be formed by etching. Electrodes formed with layers 210-218 may be referred to as "bottom" electrodes, which may refer to electrodes that are formed closer to substrate 110 than other electrodes. Here, layers 210 and 214 may be glue layers (e.g., operative to promoting bonding between layers of material) using, for example, titanium nitride (TiN) or other materials (e.g., titanium aluminum nitride—TiAlN, tantalum nitride—TaN, titanium silicon nitride—TiSiN, tantalum aluminum nitride—TaAlN, tantalum silicon nitride—TaSiN, titanium silicon nitride—TiSiN, titanium tungsten—TiW). Layers 210 and 214 may be deposited to a thickness of, for example, from about 100 Å to about 300 Å. Layer 212 may be a layer of an electrically conductive material, such as a metal, for example. Suitable metals include but are not limited to noble metals or combinations of noble metals (e.g., platinum Pt, silver—Ag, tantalum—Ta, palladium—Pd, iridium—Ir, iridium oxide—$IrO_x$, rhodium—Rh, or alloys of those metals). Here, layer 212 is depicted having platinum (Pt) and may be deposited to a thickness of, for example, from about 250 Å to about 1250 Å. Layer 216 may be deposited using, for example, an oxide material (e.g., silicon oxide—$SiO_x$) to form a layer of hard mask material having a thickness of, for example, from about 500 Å to about 1500 Å. In some examples, the thickness of hard mask layer 216 may be scaled (i.e., proportional) to the thickness of, for example, layer 212. Directly or indirectly above hard mask layer 216 may be mask layer 218 formed using, for example, a photolithographic process. In some examples, mask layer 218 may be a photoresist layer used for forming a pattern of, for example, electrodes, one of which is outlined by lines 220 and 222. A pattern may be formed by, for example, removing unwanted photoresist material using various techniques (e.g., plasma etching or wet stripping processes) and leaving behind mask layer 218.

Here, etchant 224 may be applied to etch hard mask layer 216, stopping at layer 214, using mask layer 218 having a pattern denoted by lines 220 and 222. Etchant 224 may be a fluorocarbon gas (e.g., $CHF_3/CF_4$ and argon—Ar) or any etchant that is effective on etching the material for the hard mask layer 216 (e.g., $SiO_2$). In some examples, layer 214 may serve as an etch stop for etchant 224. After etching the hard mask layer 216, mask layer 218 may be removed using any combination of dry and wet stripping processes. Hard mask layer 216, after being etched with a pattern, may be used as a patterned mask layer in subsequent etching steps. In some examples, wafer 201 and the above-described elements and processes may be varied in material, dimensions, configuration, implementation, and or aspects and are not limited to those shown and described.

Figure 2B:
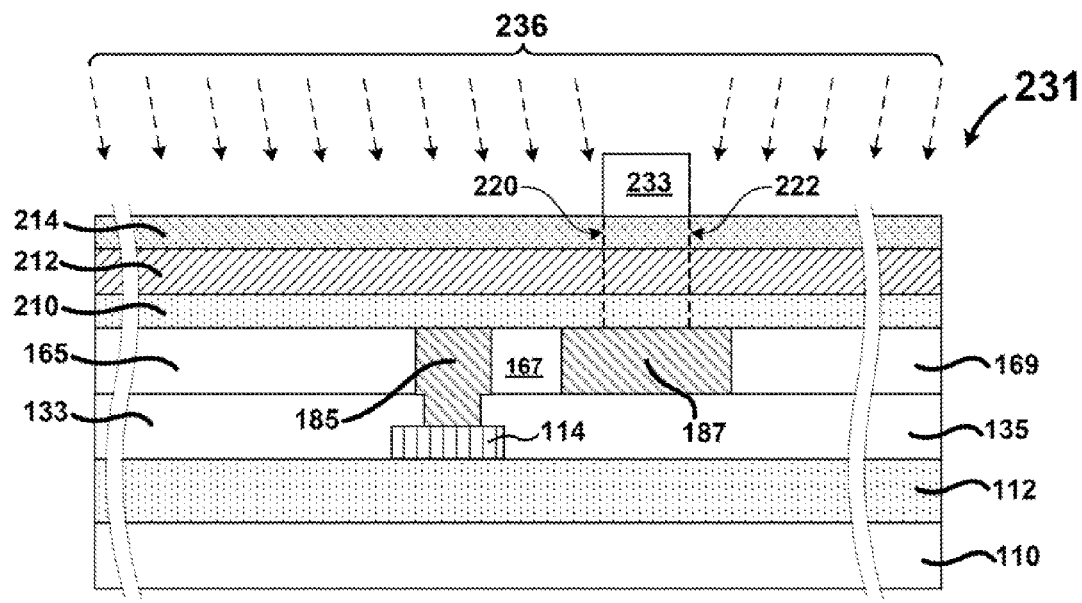
FIG. 2B is a cross-sectional view of an exemplary wafer after an exemplary etch.

FIG. 2B is a cross-sectional view of an exemplary wafer after an exemplary etch. Here, wafer 231 is shown after some material of hard mask layer 216 (see FIG. 2A) has been etched away leaving layer 233. Etchant 236 may be applied to etch layer 214 using layer 233 as a mask having a pattern indicated by lines 220 and 222. Any etchant that is effective on etching the material for the layer 214 (e.g., TiN), including but not limited to a chlorine-based etchant (e.g., chlorine—Cl and argon—Ar), may be used. Etching with a chlorine-based etchant may be performed, for example, at one or more temperatures from about 30° C. to about 350° C. For example, the etching may be performed at approximately room temperature. In some examples, one or more etch pressures between 2-20 milliTorr may be applied. In some example, layer 212 may act as an etch stop for etchant 236. In other examples, etching may continue to etch layer 212 or other methods may be used to stop after etching layer 214. As will be described in greater detail below, process temperatures for layers of material formed above the logic layer (e.g., layer 112) may be restricted to a temperature that is at or below a temperature budget $T_B$ (e.g., less than 450° C.) for circuitry and/or structures in the logic layer.

Figure 2C:
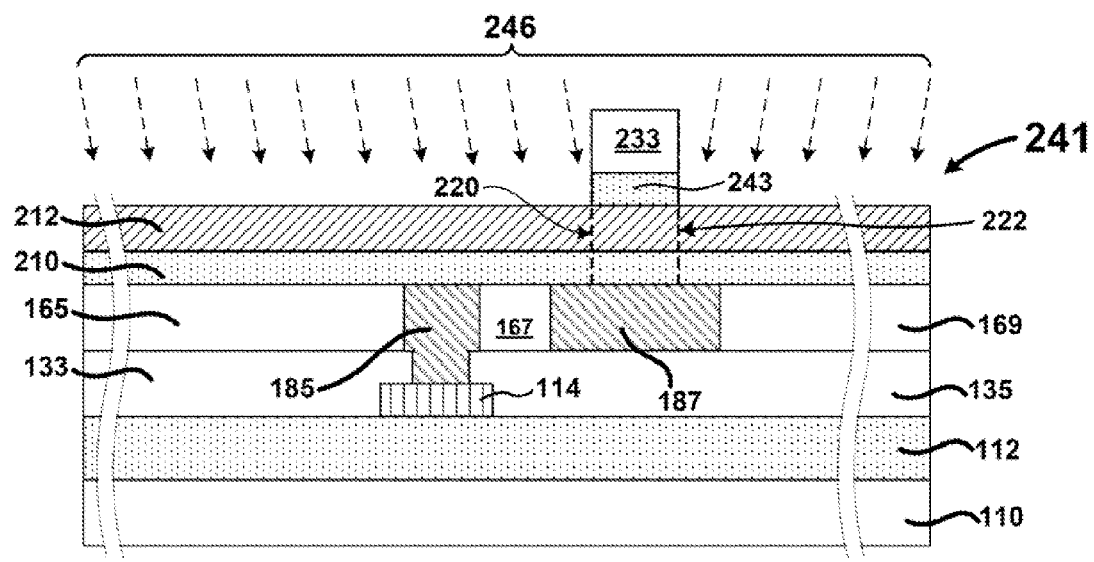
FIG. 2C is a cross-sectional view of an exemplary wafer after another exemplary etch.

FIG. 2C is a cross-sectional view of an exemplary wafer after another exemplary etch. Here, wafer 241 is shown after some material of layer 214 (see FIG. 2B) has been etched away leaving layer 243. Etchant 246 may be applied to etch layer 212 using layer 233 as a mask having a pattern indicated by lines 220 and 222. Any etching process (e.g., physical etch, chemical etch, or any combination thereof) effective at etching the material of layer 212 (e.g., platinum—Pt) may be used. In some examples, a physical etch using argon and oxygen may be performed. A physical etch may be performed, for example, at or near room temperatures (e.g., 30° C.). In other examples, a chemical etch may be performed using chlorine and oxygen. Etching with chlorine and oxygen may be performed, for example, at one or more temperatures between about room temperature to about 350° C. For example, the temperature may be about 170° C. In some examples, the described processes may be performed at one or more etch pressures from about 2 milliTorr to about 20 milliTorr. In some example, layer 210 may act as an etch stop for etchant 246. For example, when etchant 246 includes oxygen, the oxygen and the titanium nitride (TiN) in layer 210 form an oxide, titanium oxynitride ($TiO_xN_y$), having a very low etch rate and operative to act as an etch stop. In other examples, etching may continue to etch layer 210 or other methods may be used to effectuate an etch stop after etching layer 212.

Figure 2D:
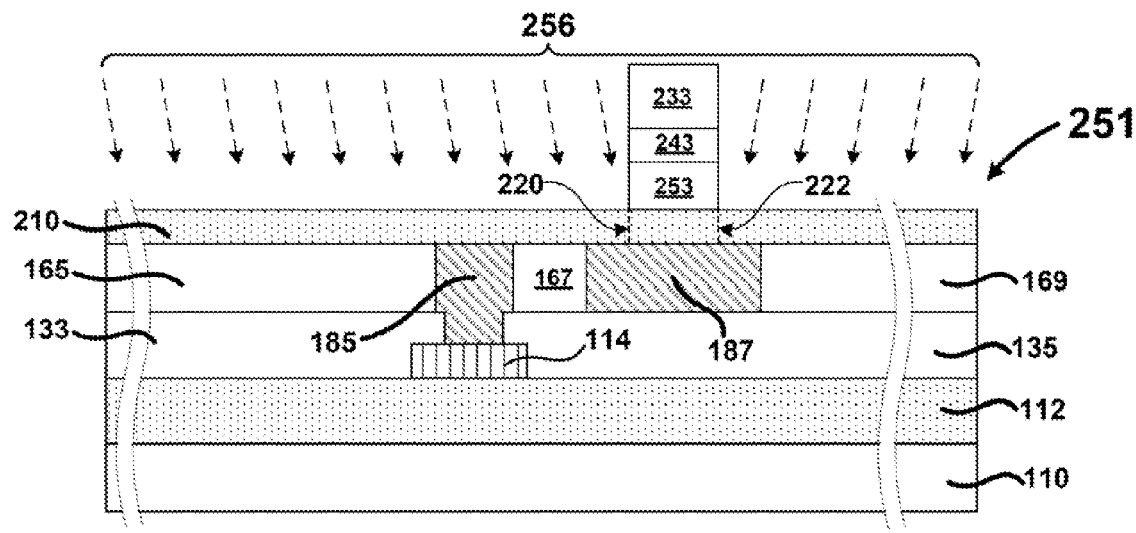
FIG. 2D is a cross-sectional view of an exemplary wafer after yet another exemplary etch.

FIG. 2D is a cross-sectional view of an exemplary wafer after yet another exemplary etch. Here, wafer 251 is shown after some material of layer 212 (see FIG. 2C) has been etched away leaving layer 253. Etchant 256 may be applied to etch layer 210 using layer 233 as a mask having a pattern indicated by lines 220 and 222. Any etchant that is effective on etching the material for the layer 210 (e.g., TiN) may be used. For example, the etchant 256 may be a chlorine-based etchant, such as chlorine and argon, or the etchant 256 may be hydrogen bromide (HBr). Etching may be performed, for example, at a temperature from about 30° C. to about 350° C. In some examples, one or more etch pressures from about 2 milliTorr to about 20 milliTorr may be applied. In other examples, other methods may be used to effectuate an etch stop after etching layer 210.

In some examples, the etching described above (e.g., etching layers 210-216, see FIGS. 2A-2D, respectively) may be performed without breaking vacuum between etches. In other examples, one or more vacuum breaks may be used. In some examples, the above-described etches, wafers, elements, and processes may be varied in material, pressures, temperatures, etchants, dimensions, configuration, implementation, and or aspects and are not limited to those shown and described.

Figure 2E:
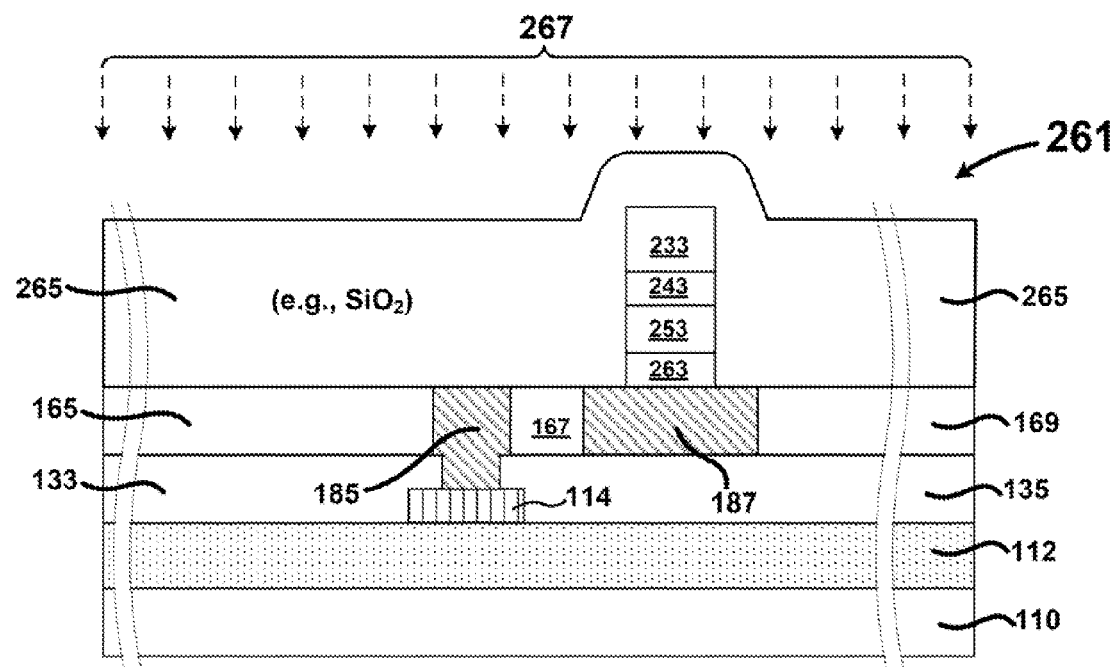
FIG. 2E is a cross-sectional view of an exemplary wafer after additional material has been deposited.

FIG. 2E is a cross-sectional view of an exemplary wafer after additional material has been deposited. Here, wafer 261 is shown after some material of layer 210 (see FIG. 2D) has been etched away leaving layer 263 and after a material 265 (e.g., silicon oxide—$SiO_x$) has been deposited. Material 265 may be deposited to a thickness of, for example, from about 3000 Å to about 5000 Å, so that it conformally covers etched materials 233-263. Wafer 261 may be planarized using various techniques as applied in the approximate direction 267 to remove upper portion of material 265 and layer 233 (e.g., silicon oxide—$SiO_x$), a hard mask that is no longer needed. Planarization, as applied in approximate direction 267 may be any method (e.g., CMP) effective on the materials for 265 and 233. For example, CMP may be implemented using an oxide-based slurry including a potassium hydroxide solvent (KOH) and fumed silica to polish material 265 and layer 233.

Figure 2F:
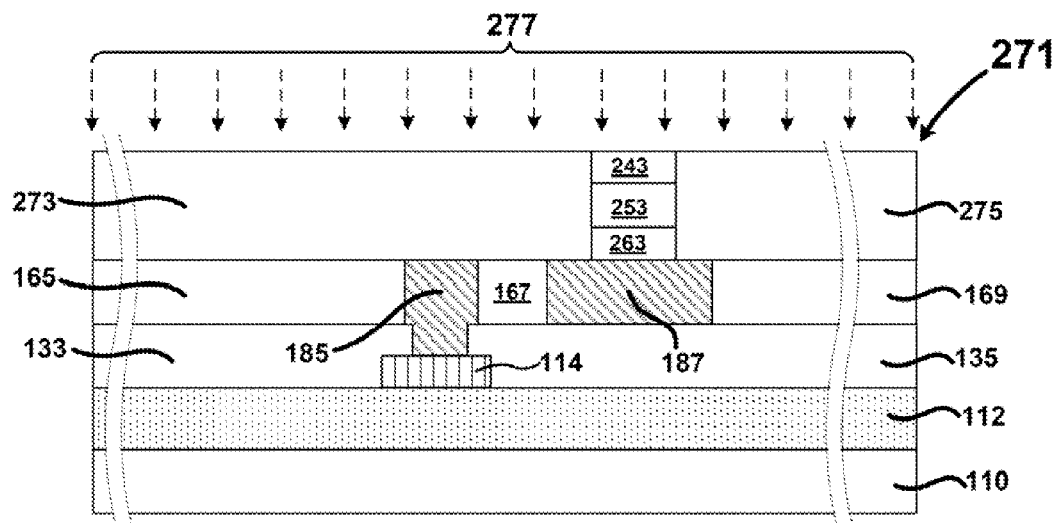
FIG. 2F is a cross-sectional view of an exemplary wafer after planarization has been performed.

FIG. 2F is a cross-sectional view of an exemplary wafer after planarization has been performed. Here, wafer 271 shows that layer 233 (see FIG. 2E) has been removed and material 265 (see FIG. 2E) has been planarized leaving material 273 and 275. Wafer 271 may be further planarized in approximate direction 277 to remove upper portion of material 273 and 275 and layer 243 (e.g., TiN). Planarization applied in approximate direction 277 may be implemented using any suitable process (e.g., CMP) that is effective on materials 273, 275, and 243, without limitation. For example, planarization techniques that may be used in approximate direction 277 may be implemented using CMP with a peroxide-based chemical.

Figure 2G:
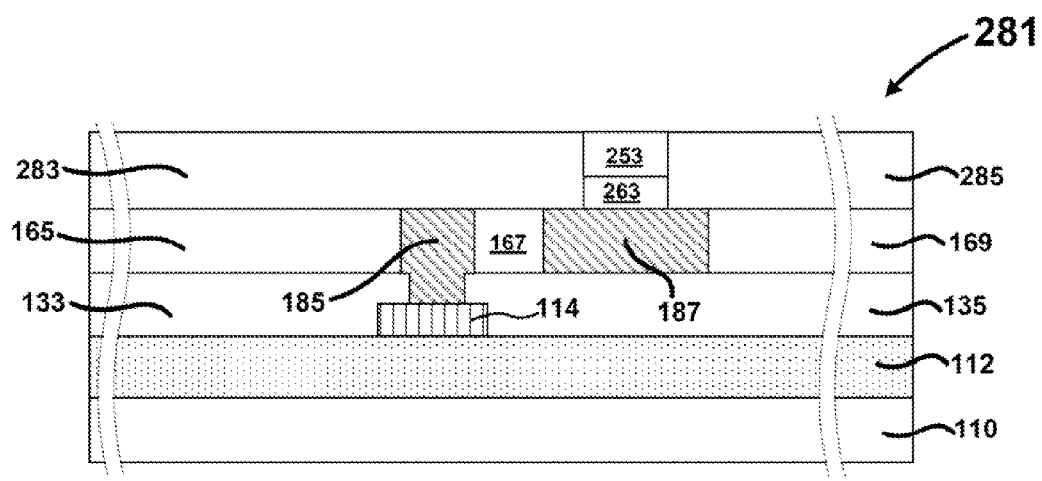
FIG. 2G is a cross-sectional view of an exemplary wafer after further planarization has been performed.

FIG. 2G is a cross-sectional view of an exemplary wafer after further planarization has been performed. Here, wafer 281 shows that layer 243 (see FIG. 2F) has been removed and material 273 and 275 have been planarized leaving material 283 and 285. The remaining layer 253 (shown with one electrode) may be configured to form "bottom" electrodes of memory cells. In some examples, planarization in approximate direction 277 (see FIG. 2F) may yield an atomically smooth and clean surface to promote nucleation growth of a memory element (e.g., comprising one or more layers of CMO). In some examples, the above-described wafers, elements, and processes (e.g., planarization methods) may be varied in material, chemicals, pressures, temperatures, dimensions, configuration, implementation, and or aspects and are not limited to those shown and described.

Figure 2H:
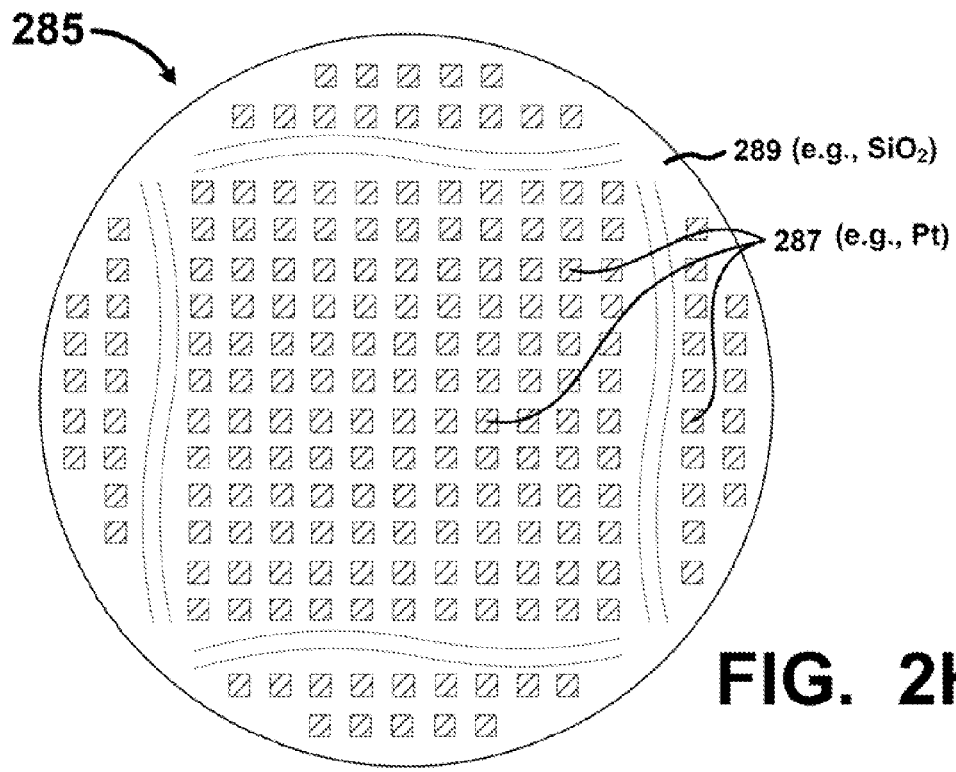
FIG. 2H is a top view of an exemplary wafer.
Figure 2I:
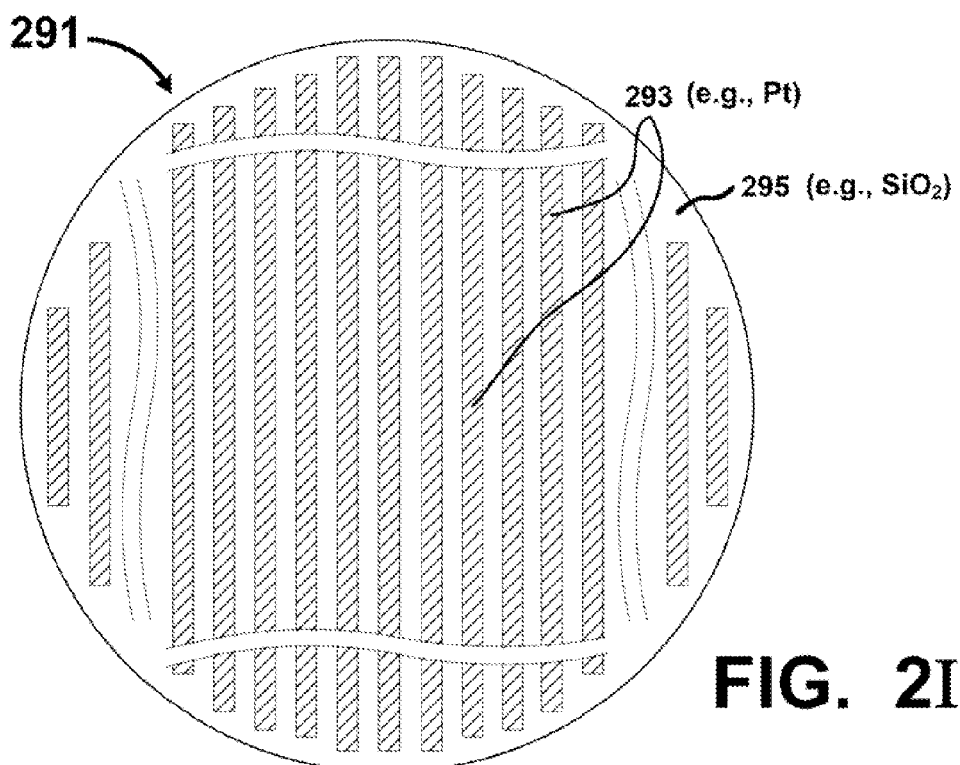
FIG. 2I is a top view of another exemplary wafer.

FIG. 2H is a top view of an exemplary wafer 285 (e.g., a silicon—Si wafer). Wafer 285 depicts a possible top view of wafer 281 (see FIG. 2G), where material 253 (see FIG. 2G) is shown as "islands" of material 287 and material 283-285 (see FIG. 2G) is shown as material 289. FIG. 2I is a top view of another exemplary wafer 291 (e.g., a silicon—Si wafer). Wafer 291 depicts another possible top view of wafer 281 (see FIG. 2G), where material 253 (see FIG. 2G) is shown as "islands" of material 293 and material 283-285 (see FIG. 2G) is shown as material 295. In some examples, the density of a structure (e.g., material 287 of FIG. 2H or material 293 of FIG. 2I) may be designed to be as high as possible (e.g., a density of at least 35%) to maintain a surface temperature for promoting a good deposition of, for example, an unetched layer of CMO. The structures may be a material such as platinum (Pt), for example. Attaining a higher surface temperature may be achieved by, for example, using an ion gun or employing designs that include more structures such as "islands" of a material (e.g., a metal) even if some of the "islands" of material serve no electrical and/or semiconducting functions post fabrication. For example, the islands of material can be a noble metal, such as platinum (Pt).

In other examples, a first layer of a CMO, made from a material including but not limited to $PrCaMnO_x$ (PCMO), $LaNiO_x$ (LNO), $SrRuO_x$ (SRO), $LaSrCrO_x$ (LSCrO), $LaCaMnO_x$ (LCMO), $LaSrCaMnO_x$ (LSCMO), $LaSrMnO_x$ (LSMO), $LaSrCoO_x$ (LSCoO), and $LaSrFeO_x$ (LSFeO) where x is nominally 3 for perovskites. Those materials may be deposited as a seed layer independent of wafer surface temperature prior to depositing a second layer of CMO (e.g., PCMO or some other CMO) on top of the first layer of CMO. Both the first and second layers of CMO are unetched layers. Selection of the CMO materials for the first and second layers of CMO will be application dependent. For example, in some implementations the first and second layers of CMO will be made from different CMO materials, such as $LaSrCoO_x$ for the first layer and PCMO for the second layer. As another example, both the first and second layers may be made from the same CMO material, such as PCMO for the first and second layers of CMO, or $LaSrCoO_x$ for the first and second layers of CMO. In this example, the first layer of CMO may be very thin (e.g., less than about 50 Å) and its growth conditions (e.g., deposition time, temperature, pressure, surface deposited on, etc.) may be selected and controlled such that the first layer grows with a preferred crystalline structure upon which to deposit the second layer of CMO. Here, the second layer is thicker than the first layer (e.g., from about 100 Å to about 300 Å for the second layer and from about 10 Å to about 30 Å for the first layer) and the growth conditions for the second layer can be controlled to ensure that the crystalline structure of the first layer is replicated in the second layer. The term replicated as used herein can include exact or nearly exact replication of the crystalline structure of one layer in another layer or can include an approximate replication (e.g., mimicking) of the crystalline structure of one layer in another layer. On the other hand, when the first and second layers of CMO are made from different materials, having a seed layer of, for example, $LaSrCoO_x$ having a thickness of from about 10 Å to about 30 Å may be used to promote a low-temperature deposition of the second layer of CMO (e.g., PCMO). For example, the second layer of CMO can have a thickness from about 100 Å to about 300 Å. In some examples, a thicker first layer (e.g., $LaSrCoO_x$) may be used without depositing a second layer (e.g., PCMO). As will be described in greater detail below, a plurality of layers of unetched CMO may be deposited upon each other for purposes other than promoting low temperature deposition of one or more of the of the plurality of layers of CMO. In the above examples, the actual thickness of the CMO layer(s) will be application dependent. As one example, the plurality of CMO layers can include a bottommost CMO seed layer, an active CMO layer deposited on the CMO seed layer, and a CMO cap layer deposited on the active CMO layer. The CMO seed layer and CMO cap layer can have thicknesses (e.g., from about 10 Å to about 30 Å) that are less than the thickness of the active CMO layer (e.g., 100 Å to about 300 Å). Actual thickness for the seed, cap, and active layers will be application dependent and the above thicknesses are provided as examples only.

Figure 3:
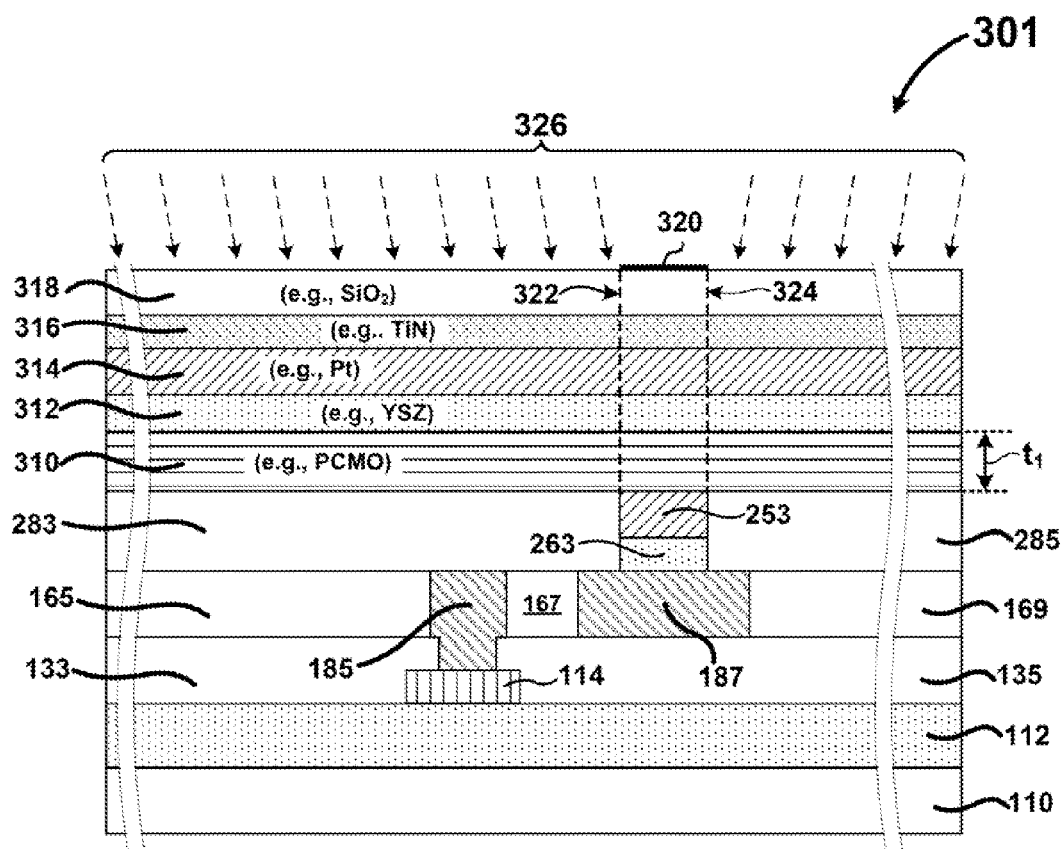
FIG. 3 is a cross-sectional view of an exemplary wafer after additional material has been deposited.

FIG. 3 is a cross-sectional view of an exemplary wafer after additional material has been deposited. Here, wafer 301 is shown after layers 310-320 have been deposited on, for example, wafer 281 (see FIG. 2G) using one or more deposition methods. Layers 310-320 may be deposited to form a memory element and electrodes for memory cells. Lines 322 and 324 depict, for example, cross-sectional boundaries of an electrode. Electrodes formed with layers 314-318 may be referred to as "top" electrodes, which may refer to electrodes that are formed vertically further away from substrate 110 than other electrodes (e.g., electrodes formed in FIG. 2G). In some examples, electrodes formed with layers 314-318 may also be referred to as "bottom" electrodes with respect to those electrodes that may subsequently formed further still away from substrate 110. For example, in forming cross-point memory or third dimensional memory, such as a those described in U.S. patent application Ser. No. 11/095,026 (incorporated above), a "top" electrode in one memory cell may be a "bottom" electrode in another memory cell (e.g., a vertically stacked multi-layer two-terminal cross-point memory array), such that some memory cells share conductive array line(s) with other memory cells in adjacent layers.

Referring back to FIG. 3, layer 310 may be a layer of conductive metal oxide (CMO) where at least a portion of the layer 310 is configured to function as a memory element. Examples of CMO may include materials known in the microelectronics art including but not limited to $PrCaMnO_x$ (PCMO), $LaNiO_x$ (LNO), $SrRuO_x$ (SRO), $LaSrCrO_x$ (LSCrO), $LaCaMnO_x$ (LCMO), $LaSrCaMnO_x$ (LSCMO), $LaSrMnO_x$ (LSMO), $LaSrCoO_x$ (LSCoO), or $LaSrFeO_x$ (LSFeO), and the like. In some examples, as shown, layer 310 may be PCMO (e.g., a perovskite material such as praseodymium calcium manganese oxide or, for example, $PrCaMnO_x$, where x is nominally 3 for perovskites) having a thickness $t_1$ of, for example, from about 100 Å to about 500 Å. In other examples, layer 310 may be $LaSrCoO_x$ having a similar thickness of, for example, from about 100 Å to about 500 Å. Next, a layer 312 (e.g., yttria-stabilized zirconia—YSZ) may be deposited to a thickness of, for example, about 50 Å, or less. As one example, the layer 312 may have a thickness of about 20 Å to about 30 Å. The layer 312 (e.g., YSZ) may be used as an electronically insulating material configured to separate CMO (e.g., PCMO layer 310) from, for example, a top electrode such as one formed with layer 314 (e.g., Pt). The layer 312 may also function as a tunnel barrier and/or an oxygen reservoir to store oxygen ions from the CMO layer 310 (e.g., a perovskite material such as PCMO), which allows oxygen ions to move freely between the layers 310 and 312 when a write voltage of sufficient magnitude and polarity is applied across the layers 310 and 312. The layer 312 is a continuous and unetched layer of thin film material that is deposited on top of the uppermost continuous and unetched layer of CMO.

In addition to YSZ, other suitable materials for the layer 312 include but are not limited to rare earth oxides, rare earth metal oxides, zirconia ($ZrO_x$), yttrium oxide ($YO_x$), erbium oxide ($ErO_x$), gadolinium oxide ($GdO_x$), lanthanum aluminum oxide ($LaAlO_x$), and hafnium oxide ($HfO_x$).

Layer 314 may be a layer of an electrically conductive material, such as a metal, noble metal, or combinations of noble metals. Suitable materials for the layer 314 include but are not limited to platinum (Pt), silver (Ag), tantalum (Ta), palladium (Pd), iridium (Ir), iridium oxide ($IrO_x$), rhodium (Rh), and alloys of those materials. Layer 314 may be deposited to a thickness of, for example, from about 250 Å to about 1250 Å. Layer 316 may be a glue layer, as described above, using titanium nitride (TiN), titanium aluminum nitride (TiAlN), tantalum nitride (TaN), titanium silicon nitride (TiSiN), titanium tungsten (TiW), tantalum aluminum nitride (TaAlN), tantalum silicon nitride (TaSiN), or other electrically conductive materials suitable as a glue layer. Layer 316 may be deposited to a thickness of, for example, from about 100 Å to about 300 Å. Layer 318 may be deposited using, for example, an oxide material, such as $SiO_2$, to form a hard mask layer with a thickness of, for example, from about 500 Å to about 2000 Å. In some examples, the thickness of layer 318 may be scaled (i.e., proportional) to the thickness of, for example, layer 314. Directly or indirectly above layer 318 may be mask layer 320 formed using, for example, a photolithographic process. In some examples, mask layer 320 may be a photoresist layer used to form a pattern of, for example, electrodes, one of which is outlined by lines 322 and 324, which is shown to be substantially aligned with a bottom electrode (e.g., material 253). A pattern may be formed by, for example, removing unwanted photoresist material and leaving behind mask layer 320 using various techniques, such as plasma ashing or wet stripping processes.

Etchant 326 may be applied to etch layer 318, stopping at layer 316, using mask layer 320 having a pattern denoted by lines 322 and 324 (i.e., etch boundaries). Etchant 326 may be a fluorocarbon gas (e.g., $CHF_3/CF_4$ and Ar) or any etchant that is effective for etching the material for the layer 318 (e.g., $SiO_2$). In some examples, layer 316 may act as an etch stop for etchant 326. In some examples, mask layer 320 may be retained for further use (e.g., use in ion implantation). In other examples, after etching a hard mask (e.g., layer 318), mask layer 320 can be stripped using any combination of dry and wet stripping processes. Layer 318, after being etched with a pattern, may be used as a patterned mask layer in subsequent etching. In some examples, wafer 301 and the above-described elements and processes may be varied in material, dimensions, configuration, implementation, and or aspects and are not limited to those shown and described.

Figure 3A:
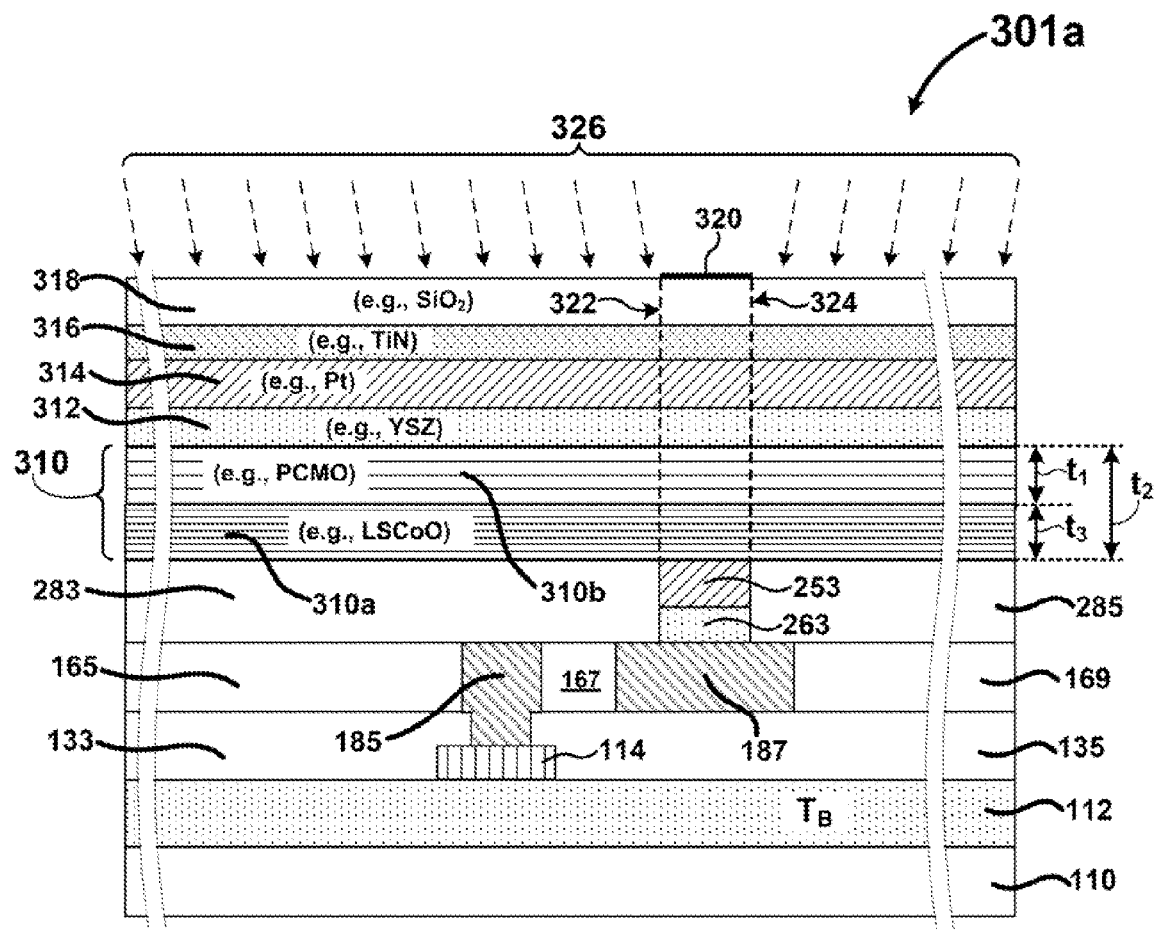
FIG. 3A is a cross-sectional view of another exemplary wafer after additional material has been deposited.

FIG. 3A is a cross-sectional view of another exemplary wafer after additional material has been deposited. Here, wafer 301a is shown after layers 310a, 310b, and 312-320 have been deposited on, for example, wafer 281 (see FIG. 2G) using one or more deposition methods. Unlike the wafer 301 of FIG. 3 where the layer 310 comprises a single layer of CMO, the layer 310 in the wafer 301a of FIG. 3A comprises a plurality of CMO layers (two are shown) denoted as a first layer 310a and a second layer 310b. The layer 310a is deposited first, for example, on wafer 281 of FIG. 2G, and the layer 310b is deposited second, directly on top of the layer 310a. Both the layer 310a and 310b are unetched layers of CMO. The layer 310a has a thickness $t_3$. A thickness $t_2$ is the combined thickness of the layers 310a and 310b (e.g., $t_2 \approx t_1 + t_3$). The layers 310a and 310b need not have the same thickness. For example, the thickness $t_3$ of the layer 310a may be less than the thickness $t_1$ of the layer 310b, or vice-versa. Preferably the thickness $t_3$ is substantially less than the thickness $t_1$.

For example thickness $t_3$ can be in a range from about 10 Å to about 30 Å and thickness $t_1$ can be in a range from about 100 Å to about 300 Å. Actual thicknesses for $t_1$ and $t_3$ will be application dependent and the above thicknesses are provided as examples only. The materials for the layers 310a and 310b may differ in the type of CMO used for each layer and may also differ in other parameters including but not limited to thickness, surface morphology, deposition method, and deposition conditions (e.g., temperature and pressure). As one example, the layer 310a may be a first type of CMO (e.g., LaSrCoO—LSCoO) and the layer 310b may be a second type of CMO (e.g., PCMO).

As was discussed above, the material for the layer 310a may be selected to promote a lower deposition temperature for the layer 310b. For example, the layer 310a may enable the layer 310b to be deposited at a temperature that is within an acceptable range of temperatures for processing the circuitry in the layer 112 (e.g., an allowable temperature range for processing CMOS circuitry in substrate 110). The layer 310a may be selected for a variety of reasons that may or may not include promoting low temperature deposition of the layer 310b. As one example of an alternative reason for depositing a plurality of different CMO layers, the layer 310a may be selected to serve as a template for a preferred crystalline structure (e.g., a single crystal structure or a polycrystalline structure) in the layer 310b as it is deposited on the layer 310a. Consequently, the crystalline structure of the layer 310a is substantially replicated (e.g., mimicked or copied) in the layer 310b. Accordingly, if the layer 310a has a crystalline structure, then after the deposition of the layer 310b, the crystalline structure of the layer 310a is replicated in the layer 310b. As yet another example, the layer 310a may be selected so that portions of the layer 310a become amorphous and electrically insulating when ion implanted with one or more species of ion. For example, bombardment by the ions may be operative to change the structure and/or electrical properties of unmasked regions in the layer 310a from an electrically conductive material (e.g., a CMO) to an electrically insulating material (e.g., an IMO). Moreover, ion implantation of the unmasked regions may change the structure of the unmasked regions from crystalline to amorphous or from an amorphous conductive region into an amorphous electrically insulating region. The ability to transform the layer 310a from a CMO to an IMO may depend in part on the thickness $t_3$. Therefore, in some applications the thickness $t_3$ is made substantially thinner (e.g., $t_3 \approx 10$ Å-30 Å) than the thickness $t_1$ (e.g., $t_1 \approx 100$ Å-250 Å) of the layer 310b because if the layer 310a is too thick, then ion implantation may not be effective at transforming regions of the layer 310a from a CMO to an IMO. Consequently, depending on the material of the CMO and its thickness, a very thin layer of CMO can be made electrically insulating after ion implantation with an appropriate species of ion (e.g., argon—Ar).

As a second example, a temperature budget $T_B$ for the fabrication of the CMOS circuitry in the layer 112 defines an upper temperature limit (e.g., $T_B \approx 450°$ C.) for processing the various structures that comprise the circuitry in layer 112 (e.g., CMOS circuitry). If that upper limit is exceeded, then the circuitry in the layer 112 can be damaged by the temperatures that exceed $T_B$. Therefore, subsequent layers that are fabricated above the layer 112 (e.g., layer(s) 310, 310a, 310b, etc.) are deposited at temperatures that are less than $T_B$ (e.g., 420° C. or less). For example, deposition temperatures for the layers 310a and 310b may be less than about 350° C.

A change in electrical characteristic from a CMO that is electrically conductive to an electrically insulating metal oxide (IMO) may be achieved by ion implantation of titanium (Ti), aluminum (Al), zirconium (Zr), silicon (Si), oxygen ($O_2$), silicon and oxygen, or a combination of those reactive metals or alloys of those reactive metals. The transformation from a conductive CMO to an insulating IMO may be based on a transformation of the crystalline material into an amorphous material and/or a chemical reaction of the implant species with the components of the CMO that cause a partwise formation of an insulating IMO (e.g., an electrically insulating perovskite). Alternatively, the transformation from a conductive CMO to an insulating IMO may be based on a transformation of the crystalline material into a crystalline material that is electrically insulating. Ion implantation (e.g., of Al, Ti, Zr) is especially beneficial for electrically conductive amorphous layers of CMO's (e.g., LaSrCoO—LSCoO or LaNiO$_3$—LNO) because the implantation effectuates a change from electrically conductive amorphous CMO to electrically insulating amorphous or crystalline IMO. As was described above, for some CMO materials, the thickness of the CMO layer (e.g., the thickness $t_3$ and/or $t_4$) may need to be made very thin (e.g., ≈10 Å-30 Å) in order for the ion implantation to effectuate a change from a CMO to an IMO in the implanted regions of the CMO layer(s).

The transformation from conductive to non-conductive may be accomplished using reactive ion implantation to effectuate B-Site replacement in the structure of the unmasked regions of the CMO layer(s). For example, the conductive metal oxides listed below include various A-site ions (denoted as AA') such as strontium—Sr, calcium—Ca, barium—Ba, lanthanum—La, praseodymium—Pr, etc., and B-site ions (shown in bold typeface) such as iron—Fe, copper—Cu, nickel—Ni, chromium—Cr, cobalt—Co, and manganese—Mn:

Conductive Metal Oxides
Ferrites: (AA')FeO$_3$;
Cuprates: (AA')CuO$_3$, (AA')$_2$CuO$_4$, . . . ;
Nickelates: (AA')NiO$_3$, (AA')$_2$NiO$_4$;
Chromates: (AA')CrO$_3$;
Cobaltates: (AA')CoO$_3$; and
Manganates: (AA')MnO$_3$.

Reactive ion implantation of the above conductive CMO's, results in some of the B-site ions being replaced by the implanted reactive metal ion species (e.g., aluminum—Al, titanium—Ti, zirconium—Zr, silicon—Si, oxygen—$O_2$, silicon and oxygen) causing a chemical reaction that substantially reduces the electrical conductivity of the CMO such that the conductive CMO becomes an insulating IMO. Consequently, the conductive CMO's are transformed into insulating IMO's as listed below, with at least a portion of the CMO's B-site ions being replaced with B-site ions aluminum—Al, zirconium—Zr, and titanium—Ti (shown in bold typeface):

Insulating Metal Oxides
Titanates: (AA')TiO$_3$;
Zirconates: (AA')ZrO$_3$;
Aluminates: (AA')AlO$_3$; and
Silicates: (AA')SiO$_3$.

Figure 3B:
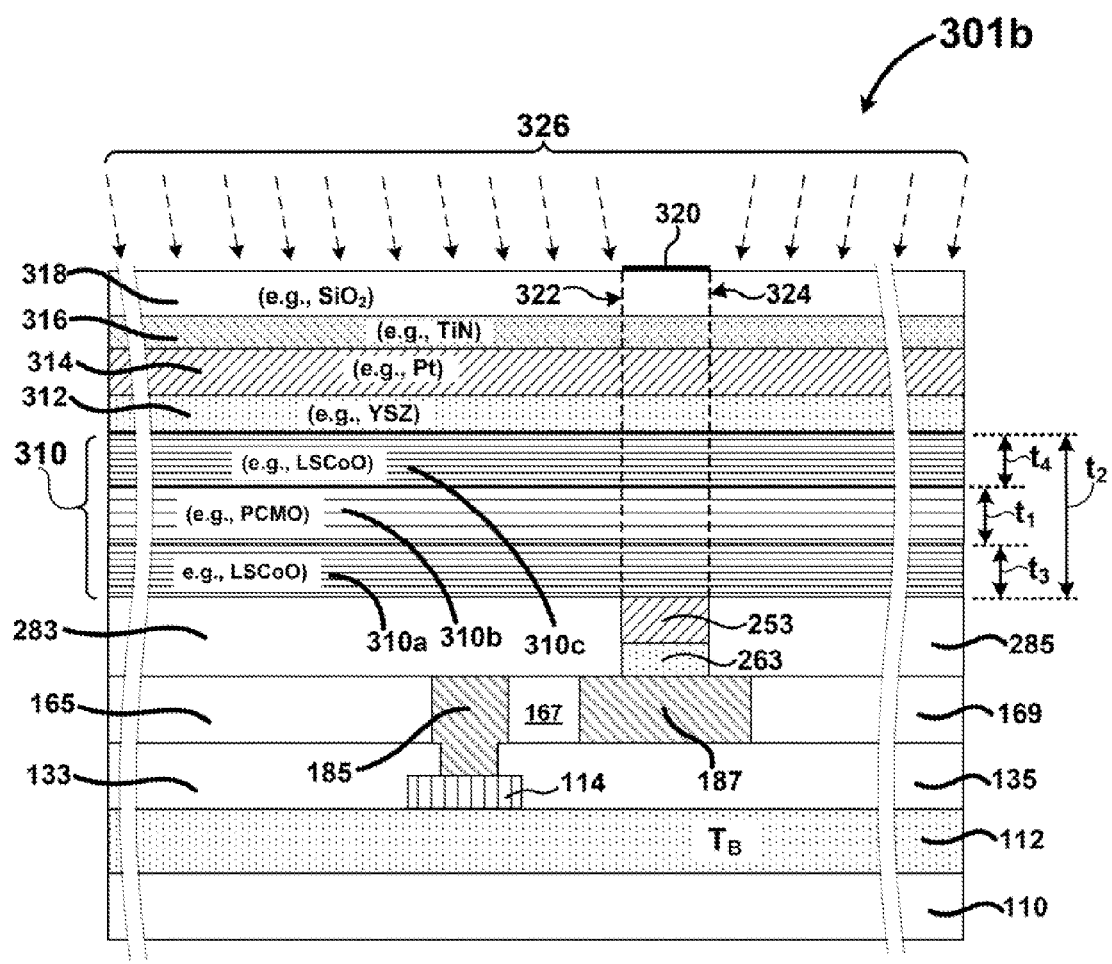
FIG. 3B is a cross-sectional view of yet another exemplary wafer after additional material has been deposited

FIG. 3B is a cross-sectional view of another exemplary wafer after additional material has been deposited. Here, in a manner similar to wafer 301a of FIG. 3A, wafer 301b is shown after layers 310a, 310b, 310c, and 312-320 have been deposited on, for example, wafer 281 (see FIG. 2G) using one or more deposition methods. Layer 310 in the wafer 301a of FIG. 3B comprises a plurality of CMO layers (three are shown) denoted as a first layer 310a, a second layer 310b, and a third layer 310c. The layer 310a is deposited first, for example, on wafer 281 of FIG. 2G, the layer 310b is deposited second, directly on top of the layer 310a, and layer 310c is deposited third, directly on top of layer 310b. The layers 310a, 310b, and 310c are unetched layers of CMO. The layer 310c has a thickness $t_4$. In FIG. 3B, thickness $t_2$ is the combined thickness of the layers 310a, 310b, and 310c (e.g., $t_2 \approx t_1 + t_3 + t_4$). Actual values for the thicknesses $t_1$, $t_3$, and $t_4$ will be application dependent. The thicknesses for $t_1$ and $t_3$ can be identical to those described above in reference to FIG. 3A. The materials for the layers 310a, 310b, and 310c may differ in the type of CMO used for each layer and may also differ in other parameters including but not limited to thickness, surface morphology, deposition method, and deposition conditions (e.g., temperature and pressure). CMO materials and the thickness $t_4$ for the layer 310c will be described in greater detail below in reference to FIG. 3I.

In FIGS. 3C through 3G, to avoid unnecessarily obscuring the description, only the single layer 310 will be depicted; however, the description in regards to FIGS. 3C through 3G may also apply to configurations where the layer 310 comprises a plurality of CMO layers (e.g., layers 310a, 310b, and 310c as depicted in FIGS. 3A and 3B) as described above.

Figure 3C:
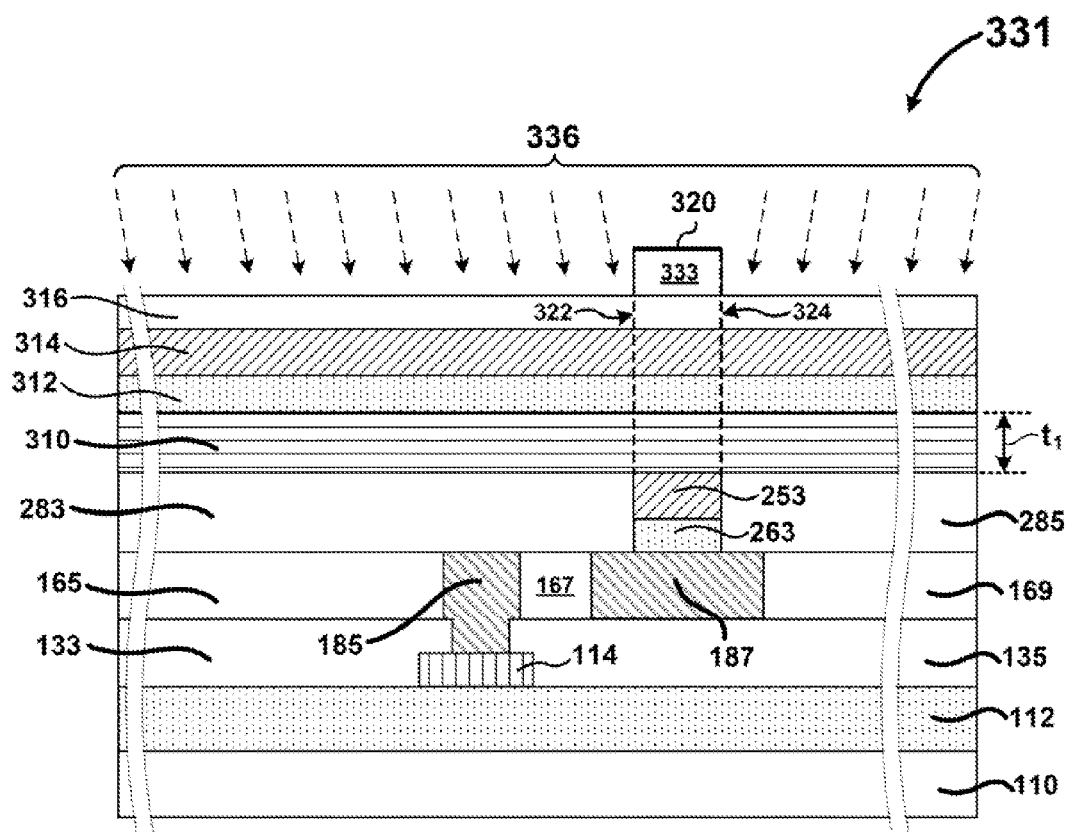
FIG. 3C is a cross-sectional view of an exemplary wafer after an exemplary etch.

FIG. 3C is a cross-sectional view of an exemplary wafer after an exemplary etch. Here, wafer 331 is shown after some material of layer 318 (see FIG. 3) has been etched away leaving layer 333. Etchant 336 may be applied to etch layer 316 using layer 333 as a mask having a pattern indicated by lines 322 and 324. Here, layer 316 is shown having TiN material. Any etchant that is effective for etching the material for the layer 316 (e.g., TiN), such as a chlorine-based etchant (e.g., chlorine and argon), may be used. Etching with a chlorine-based etchant may be performed, for example, in one or more temperatures from about 30° C. to about 350° C. In some examples, one or more etch pressures from about 2 milliTorr to about 20 milliTorr may be applied. In some examples, layer 314 may act as an etch stop for etchant 336. In other examples, etching may continue to etch layer 314 or other methods may be used to stop after etching layer 316.

Figure 3D:
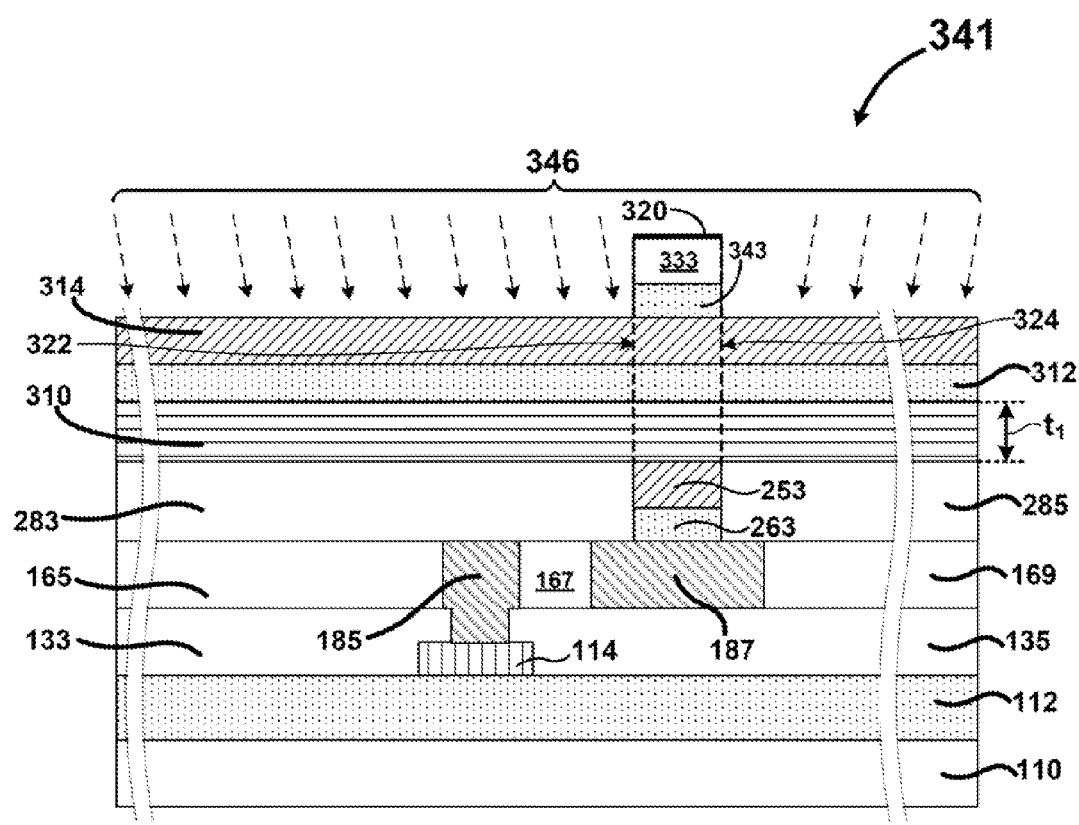
FIG. 3D is a cross-sectional view of an exemplary wafer after another exemplary etch.

FIG. 3D is a cross-sectional view of an exemplary wafer after another exemplary etch. Here, wafer 341 is shown after some material of layer 316 (see FIG. 3B) has been etched away leaving layer 343. Etchant 346 may be applied to etch layer 314 using layer 333 as a mask having a pattern indicated by lines 322 and 324. Here, layer 314 is shown having metal (e.g., Pt). An etch process effective on etching the material of the layer 314 (e.g., physical etch, chemical etch, or combination thereof) may be used. In some examples, a physical etch using argon and oxygen may be performed. A physical etch may be performed, for example, at or near room temperature (e.g., 30° C.). In other examples, a chemical etch may be performed using chlorine and oxygen. Etching with chlorine and oxygen may be performed, for example, at one or more temperatures from about 170° C. to about 350° C. In some examples, one or more etch pressures from about 2 milliTorr to about 20 milliTorr may be applied. In some examples, layer 312 may act as an etch stop for etchant 346. In other examples, other methods may be used to stop after etching layer 314. In some examples, the above-described etches, wafers, elements, and processes may be varied in material, pressures, temperatures, etchants, dimensions, configuration, implementation, and or aspects and are not limited to those shown and described.

Figure 3E:
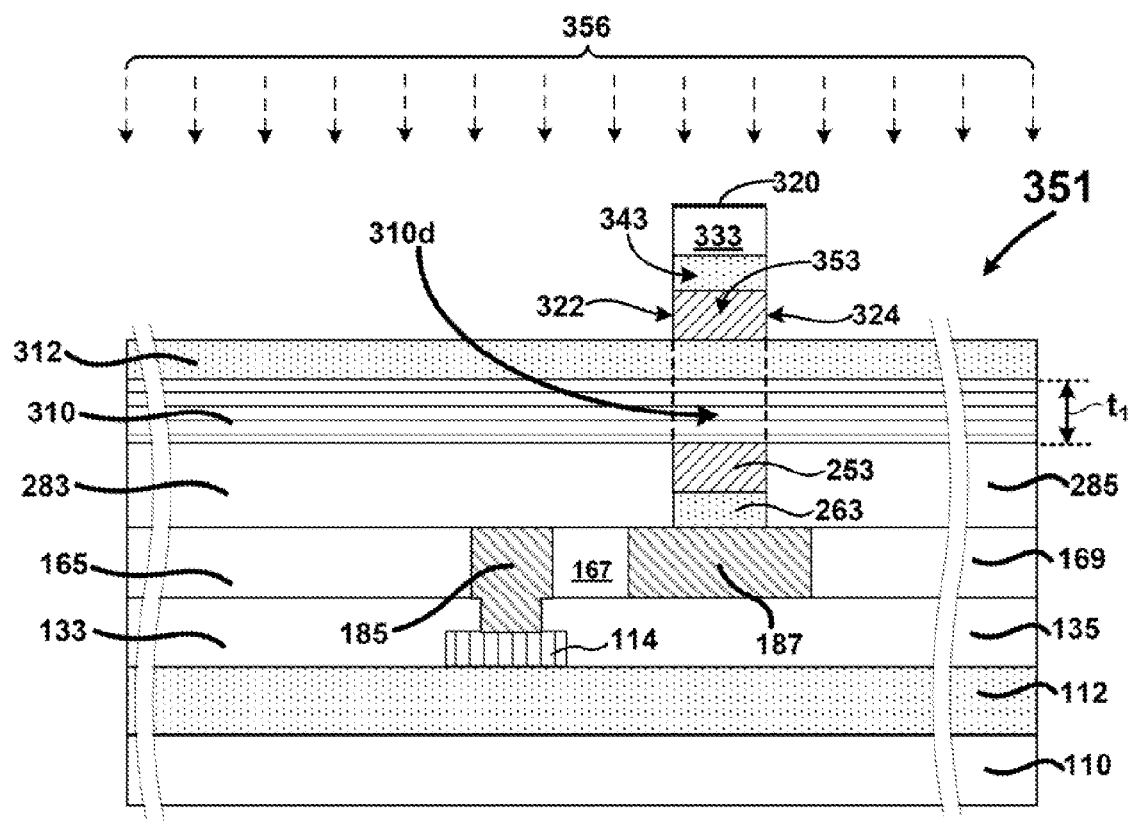
FIG. 3E is a cross-sectional view of an exemplary wafer after yet another exemplary etch.

FIG. 3E is a cross-sectional view of an exemplary wafer after yet another exemplary etch. Here, wafer 351 is shown after some material of layer 314 (see FIG. 3D) has been etched away leaving layer 353. One or more layers of wafer 351 (e.g., layer 310) may be ion implanted using a suitable implant material 356 such as argon (Ar), aluminum (Al), titanium (Ti), zirconium (Zr), or xenon (Xe). For example, if layer 310 is implemented using a CMO such as PCMO, then argon or xenon may be used as the implant species. Xenon may be as much as four to five times more effective in implanting PCMO compared to argon as an implant species. On the other hand, some CMO's such as LSCoO, may not be rendered electrically insulating if implanted by an inert ion such as xenon or argon. Accordingly, those CMO's may require a reactive ion implant where the species of ion reacts with exposed portions of the layer being implanted to form an electrically insulating layer (e.g., IMO) in the implanted portions (e.g., Al, Ti, or Zr). Additionally, for some CMO's, the thickness of the layer must be sufficiently thin (e.g., less than about 50 Å) in order for the reactive ion implantation to effectuate a transformation from CMO to IMO. As one example, if layer 310 is implemented using LNO, for example, then aluminum (Al) may be used. As another example, if the CMO layer is implemented with LSCoO, then titanium (Ti) may be used and the thickness of the LSCoO can be sufficiently thin (e.g., from about 10 Å to about 30 Å) to ensure the layer becomes electrically insulating as a result of the reactive ion implantation. Implanting layer 310, without etching, forms discrete regions 310d in the layer 310 that define memory elements (e.g., for memory cells). The discrete regions 310d are substantially defined by the shapes of "top" memory electrodes (e.g., mask layer 320). In some examples, mask layer 320, if it has not been removed, may be stripped using any combination of dry and wet stripping processes. In some examples, the above-described ion implantation, wafers, elements, and processes may be varied in material, pressures, temperatures, dimensions, configuration, implementation, and or aspects and are not limited to those shown and described.

Figure 3F:
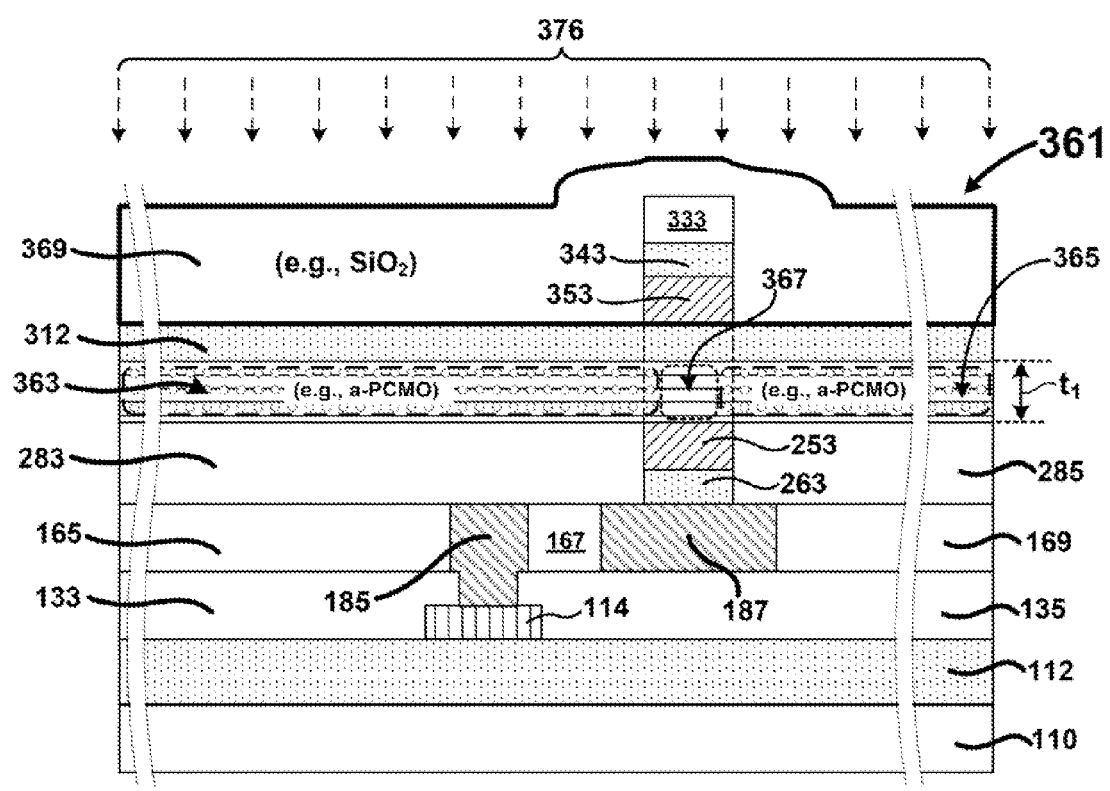
FIG. 3F is a cross-sectional view of an exemplary wafer after ion implantation.

FIG. 3F is a cross-sectional view of an exemplary wafer after ion implantation. Here, wafer 361 is shown after PCMO layer 310 (see FIG. 3E) has been ion implanted to form amorphous-PCMO (a-PCMO) regions 363-365 that are substantially electrically non-conductive and a substantially crystalline PCMO region 367 that is substantially electrically conductive. The ion implantation is designed to change a property of the regions 363 and 365 of the PCMO layer into an amorphous-PCMO structure that are electrically non-conductive regions (e.g., electrically insulating) operative to prevent electrical shorts between adjacent memory cells. For example, the PCMO in the region 367, where a top electrode (i.e., material 353) blocks ion implantation to the region 367, has a substantially crystalline structure operative to store data as a plurality of conductivity profiles (e.g., resistive states). PCMO in regions not blocked by electrodes (e.g., regions 363-365) is transformed by the ion implantation into non-conductive amorphous-PCMO (e.g., an IMO), to form an electrically insulating structure between adjacent memory cells that electrically isolates adjacent memory cells from one another. In other examples, layer 310 may be deposited with lanthanum nickel oxide (LaNiO$_x$) (not shown) and implanted with aluminum to form an insulator (LaNiAlO$_x$)) in regions 363-365. In these examples, the region 367 remains electrically conductive LaNiO$_x$.

In FIG. 3F material 369 (e.g., silicon oxide—SiO$_x$) has also been deposited onto wafer 361 using one or more deposition methods. Material 369 may be deposited to a thickness of, for example, from about 3000 Å to about 5000 Å, to completely cover etched materials 333-353. Wafer 361 may be planarized using various techniques (e.g., CMP) as applied in approximate direction 376 to remove upper portions of material 369 and layer 333 (e.g., silicon oxide—SiO$_x$), a hard mask that is no longer needed. Planarization applied in approximate direction 376 may be any method effective for removing the material 369. For example, planarization applied in approximate direction 376 may use an oxide-based slurry including a potassium hydroxide solvent (KOH) and fumed silica to planarize material 369 and layer 333. In some examples, planarization may be stopped after material 333 has been removed. In other examples, planarization may continue to achieve a thickness of, for example, about 400 Å in material 353 (e.g., Pt) or a combination of materials 353 and 343 (e.g., TiN).

Figure 3G:
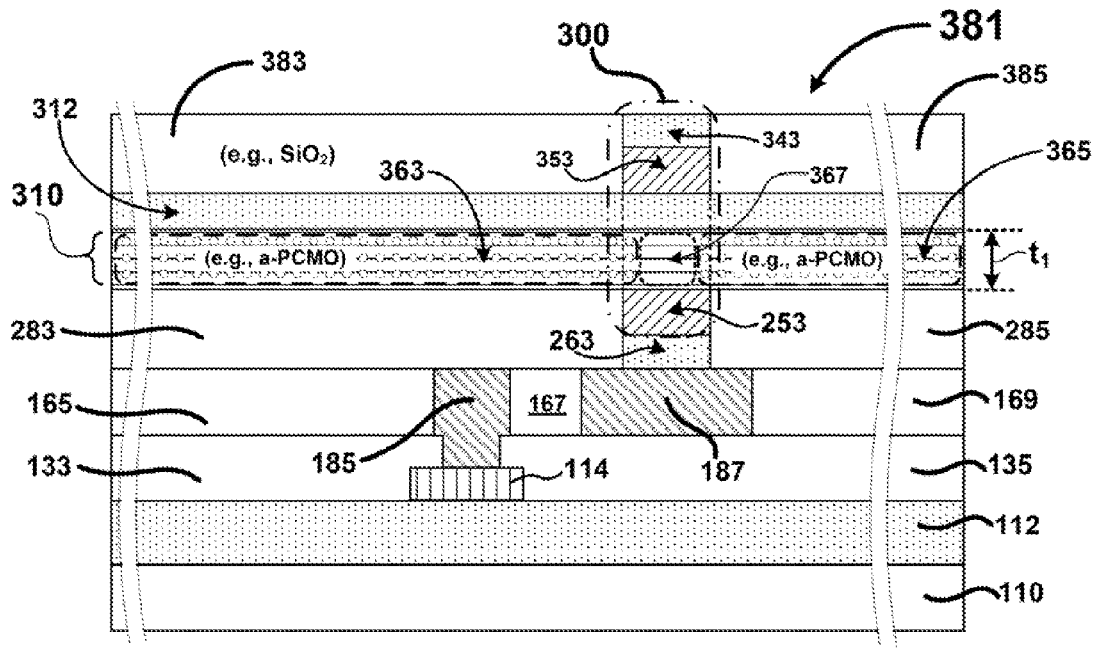
FIG. 3G is a cross-sectional view of an exemplary wafer after planarization has been performed.

FIG. 3G is a cross-sectional view of an exemplary wafer after planarization has been performed. Here, wafer 381 shows that layer 333 (see FIG. 3F) has been removed and material 369 has been planarized leaving material 383 and 385. The remaining layer 353 (shown with one electrode) may be configured to form "top" electrodes of memory cells above a continuous, unetched layer of CMO that includes an electrically conductive region 367 (e.g., crystalline CMO) and electrically non-conductive regions 363-365 (e.g., amorphous CMO). The discrete regions defined by region 367 form at least a portion of the memory element for each memory cell. In some examples, the above-described wafers, elements, and processes (e.g., implantation and polishing methods) may be varied in material, chemicals, pressures, temperatures, dimensions, configuration, implementation, and or aspects and are not limited to those shown and described.

Figure 3H:
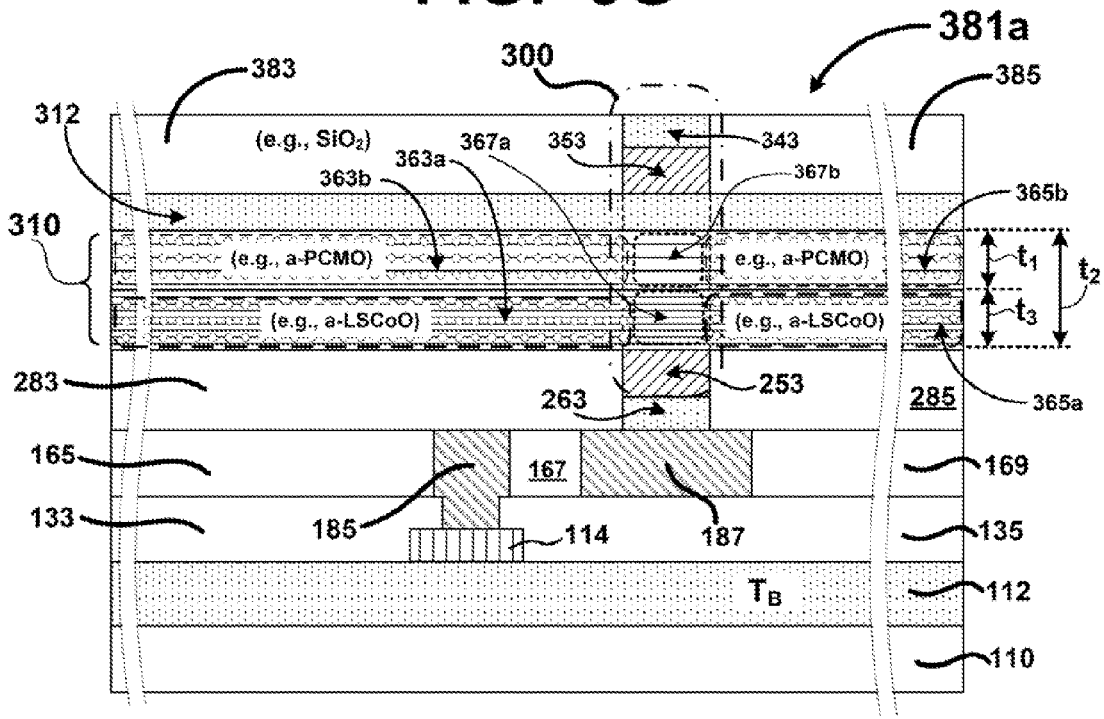
FIG. 3H is a cross-sectional view of another exemplary wafer after planarization has been performed.

FIG. 3H is a cross-sectional view of an exemplary wafer after planarization has been performed. Here, wafer 381a is substantially identical to wafer 381 of FIG. 3G with the exception being the layer 310 comprises a plurality of CMO layers (see 310a and 310b in FIG. 3A) instead of the single CMO layer 310 depicted in FIG. 3G. After an ion implantation process, the layers 310a-310b not protected by electrode 353 are bombarded by ions and structurally altered (e.g., from crystalline CMO to amorphous CMO). As one example, if the layer 310a comprises LSCoO and the layer 310b comprises PCMO, then after the ion implantation process, the layer 310a comprises amorphous LSCoO regions 363a-365a and a crystalline LSCoO region 367a, and the layer 310b comprises amorphous PCMO regions 363b-365b and a crystalline PCMO region 367b. The regions 367a and 367b form at least a portion of the memory element for each memory cell and are electrically in series with each other. Although LSCoO and PCMO are depicted, other types of CMO may be used for the layers 310a and 310b. As described above, the amorphous regions 363a-365a and 363b-365b are operative to electrically isolate memory cells from one another.

Figure 3I:
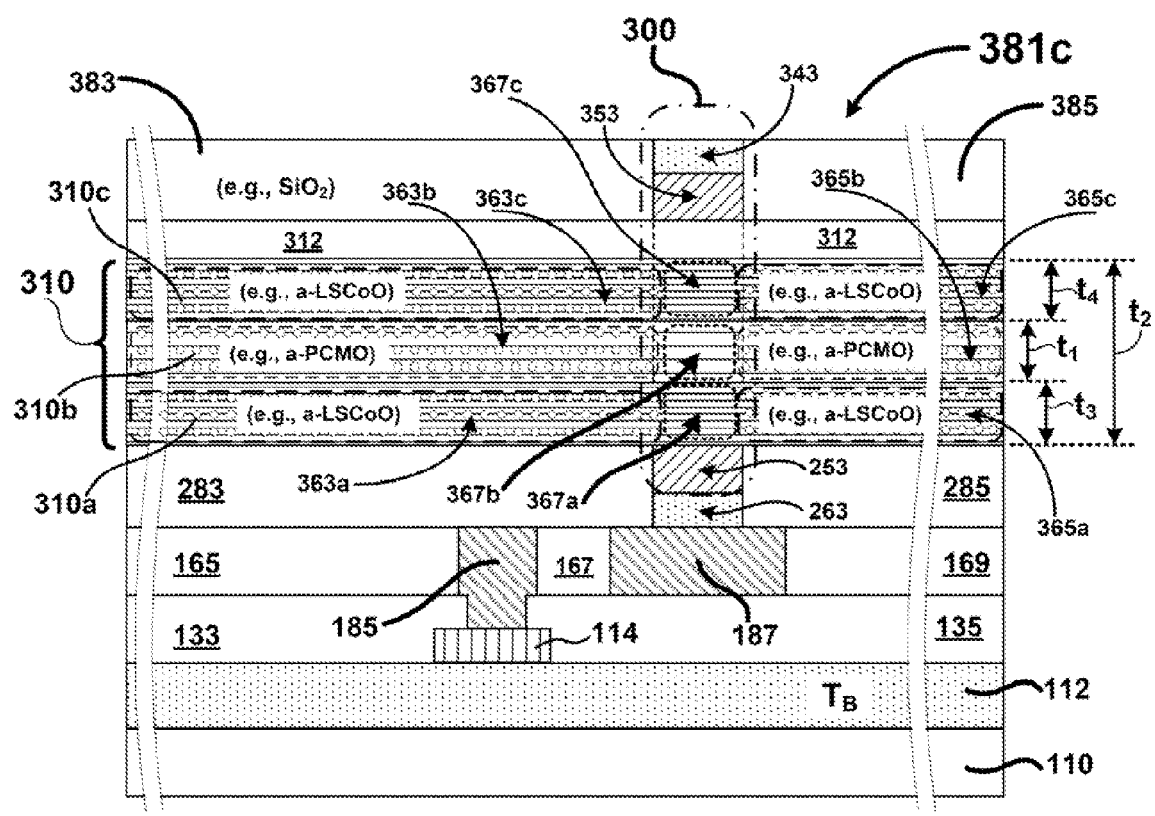
FIG. 3I is a cross-sectional view of yet another exemplary wafer after planarization has been performed.

FIG. 3I depicts another example of multiple layers of continuous and unetched CMO. The three continuous and unetched layers of CMO that were deposited as depicted in FIG. 3B (310a, 310b, and 310c) have undergone ion implantation as described above such that each layer includes IMO regions (363a, 363b, 363c, 365a, 365b, and 365c) and CMO regions (367a, 367b, and 367c). Thicknesses $t_3$ and $t_4$ may be substantially less than the thickness $t_1$ as was described above, particularly if necessary to effectuate the transformation from CMO to IMO in the regions (363a, 363c, 365a, 365c) bombarded by the ion implantation process. The materials and thicknesses for the CMO layers will be application dependent. Here, the multiple layers that comprise 310 (e.g., 310a, 310b, and 310c) form a tri-layer sandwich of LSCoO/PCMO/LSCoO.

Parameters for the layer 310a may be selected to perform one or more functions in formation of the memory cell including but not limited to serving as a seed layer for crystallization of the layer 310b, allow low temperature deposition of the layer 310b (e.g., below temperature $T_B$), a thickness $t_3$ (e.g., about 30 Å or less) selected to allow regions (363a, 365a) to be transformed into IMO by ion implantation, material selected (e.g., LSCoO) to allow for crystallization of the portion of the layer 310a that is in contact with layer 253 (e.g., Pt), or any combination of those selection parameters.

Parameters for the layer 310c may be selected to perform one or more functions in formation of the memory cell including but not limited to serving as a cap layer for an active portion (367b) of the layer 310b and operative to improve data retention of the memory cell, a thickness $t_4$ (e.g., about 30 Å or less) selected to allow regions (363c, 365c) to be transformed into IMO by ion implantation, material selected (e.g., LSCoO) to allow for crystalline growth of the layer 310c as it is deposited on the layer 310b, material selected for compatibility with the layer 312 (e.g., to prevent ion motion between layer 312 and 367b after program or erase operations), increase memory cell current during data operations (e.g., read current), increase memory effect, or any combination of those selection parameters. Data retention is a measure of the ability of a memory cell to retain stored data over time, that is, conductivity values that are indicative of stored data do not substantially drift over time so that the stored data can be reliable read during a read operation (e.g., by the active circuitry in layer 112). Memory effect is a measure of the difference in read current magnitudes for different states of stored data (e.g., a logic "0" vs. a logic "1"). The larger the difference, the easier it is for sense circuitry to accurately determine if data read is indicative of the selected memory cell being in a programmed or erased state. Essentially, the larger the difference, the higher the signal-to-noise ratio (S/N).

Parameters for the layer 310b may be selected to perform one or more functions in formation of the memory cell including but not limited to growth with a preferred crystalline structure when deposited on layer 310a, a thickness $t_1$ selected (e.g., about 100 Å to 300 Å) to provide a desired aspect ratio for the memory cell and/or to improve memory effect, or any combination of those selection parameters.

Figure 4:
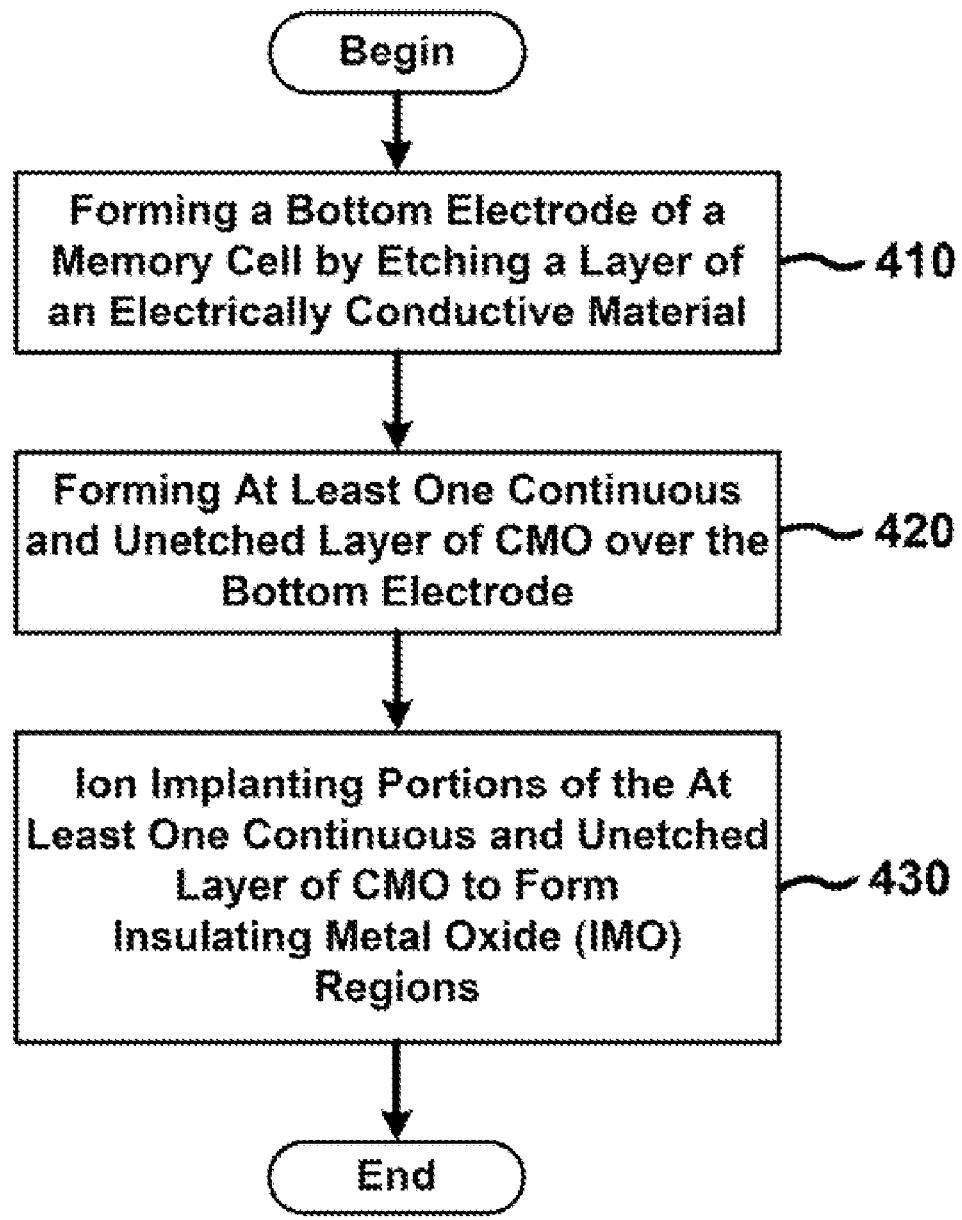
FIG. 4 depicts an exemplary process for forming an electrode of a memory cell.

FIG. 4 depicts an exemplary process for forming an electrode of a memory cell. At a stage 410, a bottom electrode of a memory cell may be formed by etching a layer of an electrically conductive material. The electrically conductive material may be a noble metal such as a layer of platinum (e.g.: layer 212, FIG. 2C). For example, one or more layers of material (e.g.: layers 210-218, FIG. 2A) may be deposited including a mask layer (e.g.: layer 218, FIG. 2A) and a hard mask layer (e.g.: layer 216, FIG. 2A) having a pattern for a bottom electrode. The layers may be etched as described in FIGS. 2A-2F to form a bottom electrode (e.g.: material 253, FIG. 2G). At a stage 420, after forming the bottom electrode, at least one continuous and unetched layer of a conductive oxide material (CMO) (e.g., PCMO, LSCoO, LNO, or the like) is formed, without etching, over the bottom electrode. At a stage 430, the at least one continuous and unetched layer of CMO may be ion implanted as described in reference to FIG. 3E, to form IMO regions. For example, after the ion implantation at the stage 430, the CMO layer 310 includes IMO 363-365 as depicted for a single layer of CMO in FIG. 3G, or the CMO layer 310 includes IMO regions 363a-365a and 363b-365b as depicted in FIG. 3H or IMO regions 363a-363c and 365a-365c in FIG. 3I, where the layer 310 comprises multiple layers of CMO (e.g., LSCoO and PCMO). The IMO regions are outside the area intended for memory cells formation such that conductive region 367 in FIG. 3G, conductive regions 367a-367b in FIG. 3H, and conductive regions 367a-367c in FIG. 3I are substantially positioned between the top and bottom electrodes in the area intended for memory cells. In some examples, the above-described wafers, elements, and processes may be varied in material, chemicals, pressures, temperatures, dimensions, configuration, implementation, and or aspects and are not limited to those shown and described.

Figure 5:
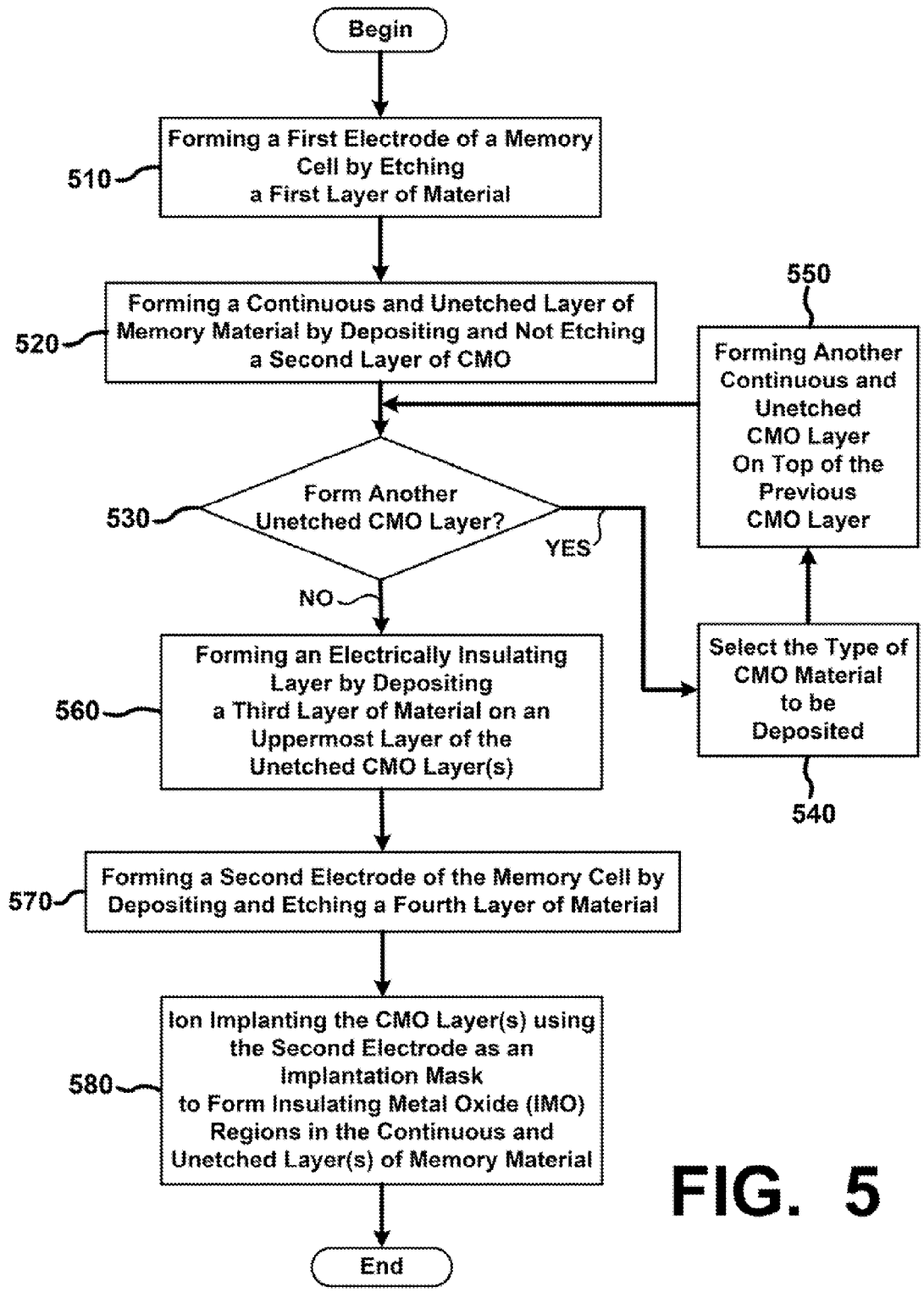
FIG. 5 depicts an exemplary process for forming a memory cell.

FIG. 5 depicts an exemplary process for forming a memory cell. At a stage 510, a first electrode of a memory cell is formed by etching a first layer of material, for example, an electrically conductive material such as a noble metal (e.g., layer 212, FIG. 2C). At a stage 520, a second layer of material is deposited to form a continuous and unetched layer of memory material, such as a layer of CMO (e.g., PCMO, LSCoO, LNO, or the like). The second layer is not etched after it is deposited so that the layer of memory material (e.g., layer 310 in FIG. 3, FIG. 3A, or FIG. 3B) remains a continuous layer. The second layer may comprise a single layer 310 as depicted in FIG. 3 or may comprises multiple layers (e.g., layers 310a, 310b, 310c). At a stage 530, the decision to add layers to the second layer (e.g., 310) is made. If the "YES" branch is selected, then at a stage 540 the material for the next CMO layer to be deposited is selected (e.g., PCMO, LNO, LSCoO, etc.). At a stage 550 another continuous and unetched CMO layer is formed on top of the previous CMO layer (e.g., 310b is deposited on 310a or 310c is deposited on 310b). After the stage 550, the stage 530 is revisited to determine if another unetched CMO layer is to be deposited. If the "NO" branch is taken, then at a stage 560 an electronically insulating layer (e.g., YSZ) may be formed by depositing a third layer of material above the second layer of material, that is on the uppermost CMO layer in 310 (e.g., layer 310b or 310c). The deposition of the third layer occurs prior to formation of a second electrode for the memory cell. At a stage 570, a second electrode of a memory cell may be formed by depositing and etching a fourth layer of material, for example, an electrically conductive material such as a noble metal (e.g.: layer 314, FIG. 3D). At a stage 580, the second layer of material, without etching, may be ion implanted to transform one or more regions of the continuous and unetched layer of memory material into an electronically insulating material (e.g., IMO) operative to electrically isolate the electrically conductive memory material of adjacent memory cells from one another (e.g., regions 363, 365, 363a-363c, 365a-365c). In some examples, the above-described wafers, elements, and processes may be varied in material, chemicals, pressures, temperatures, dimensions, configuration, implementation, and or aspects and are not limited to those shown and described.

Figure 6:
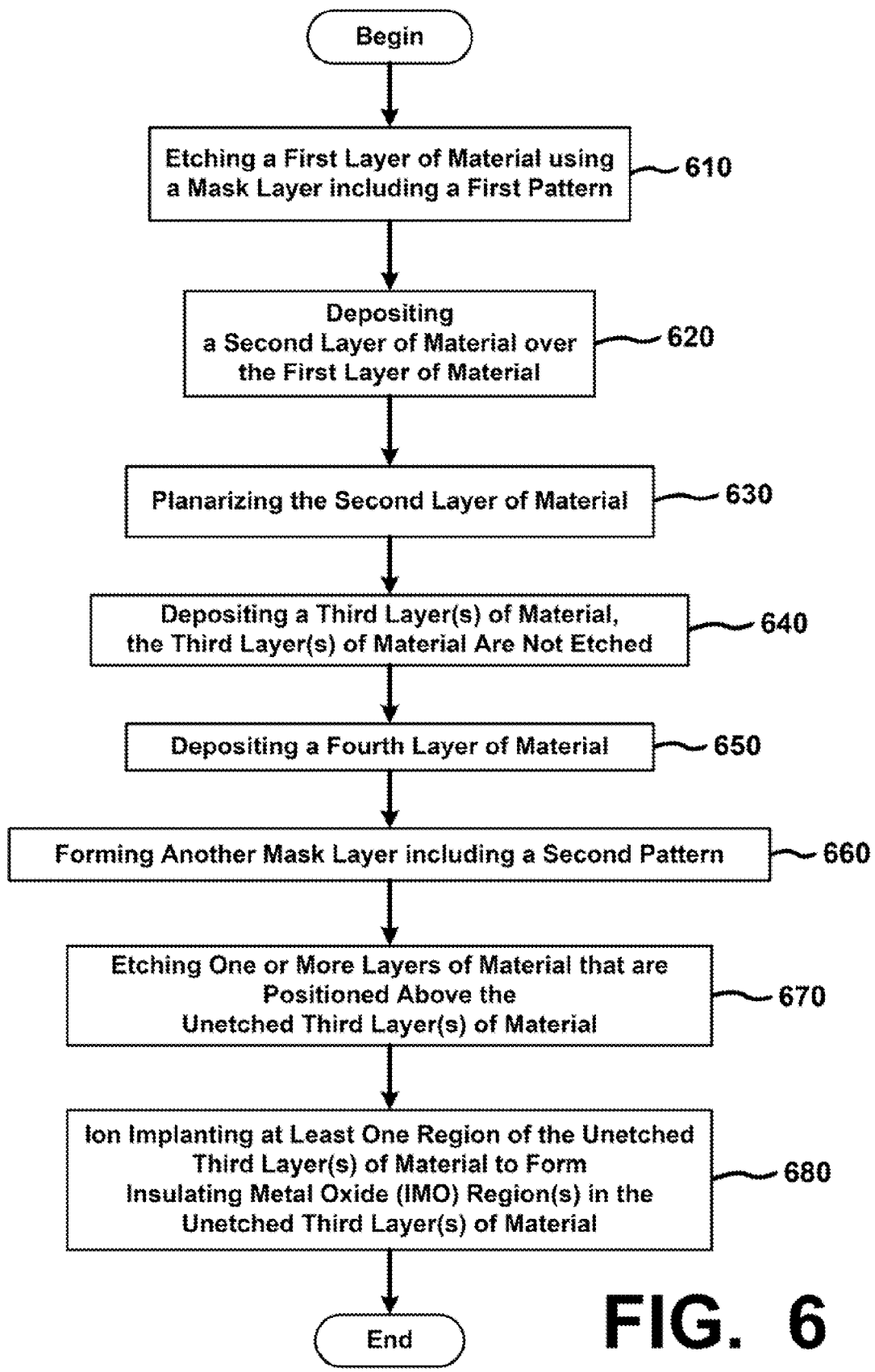
FIG. 6 depicts an exemplary process for fabricating a wafer.

FIG. 6 depicts an exemplary process for fabricating a wafer. Here, a mask layer with a pattern is formed (e.g., using photolithography technologies) over one or more layers of deposited material. In some examples, the pattern may be formed over a layer of material for use as a hard mask layer (e.g., a layer of oxide material, such as silicon oxide—$SIO_x$). At a stage 610, one or more layers of previously deposited material (denoted as a first layer of material) may be etched using a mask layer including a first pattern, for example, using methods described herein. After the etching at the stage 610, at a stage 620, a second layer of material (e.g., silicon oxide—$SIO_x$) may be deposited onto the first layer of material. At a stage 630, the second layer of material is planarized to remove some deposited material and to provide a substantially smooth surface upon which subsequent layers of material will be deposited. At a stage 640, a third layer of material (e.g., one or more layers of CMO), which does not need etching to provide one or more intended function (e.g., data storage in discrete portions 367, 367b) is deposited. At a stage 650, one or more layers of material (denoted as a fourth layer of material) are deposited on top of the unetched third layer of material. At a stage 660, another mask layer including a second pattern is formed (e.g., using photolithography techniques) over the prior layers of material(s) deposited above the unetched third layer. In some examples, the mask layer may be formed over a fifth layer of material operative as a hard mask layer (e.g., a layer of oxide material, such as silicon oxide—$SiO_x$). At a stage 670, at least one of the one or more layers of material (e.g., the fourth layer of material) positioned above the unetched third layer of material are etched according to the second pattern. At a stage 680, ion implantation of one or more regions (e.g., unmasked regions) of the unetched third layer of material may be performed to, for example, to change chemical, molecular, crystalline, or electrical properties or structure of the material in exposed regions to provide electrically insulating features without having to etch and deposit additional materials, saving both time, cost, materials, and labor to produce an electrically insulating layer (i.e., an unetched layer of PCMO, LSCoO, LNO, or other material that has reduced electrically conductive properties when exposed to ion implantation). In some examples, the unetched third layer of material is deposited and formed over at least one etched layer of material and "sandwiched" by (i.e., disposed between) at least another layer of etched material over it. In other examples, the third layer of material comprises multiple layers of continuous and unetched memory materials (e.g., unetched layers 310a and 310b of LSCoO and PCMO depicted in FIGS. 3A and 310a, 310b, and 310c depicted in FIG. 3B). In some examples, the above-described wafers, elements, and processes may be varied in material, chemicals, pressures, temperatures, dimensions, configuration, implementation, and or aspects and are not limited to those shown and described.

Figure 7A:
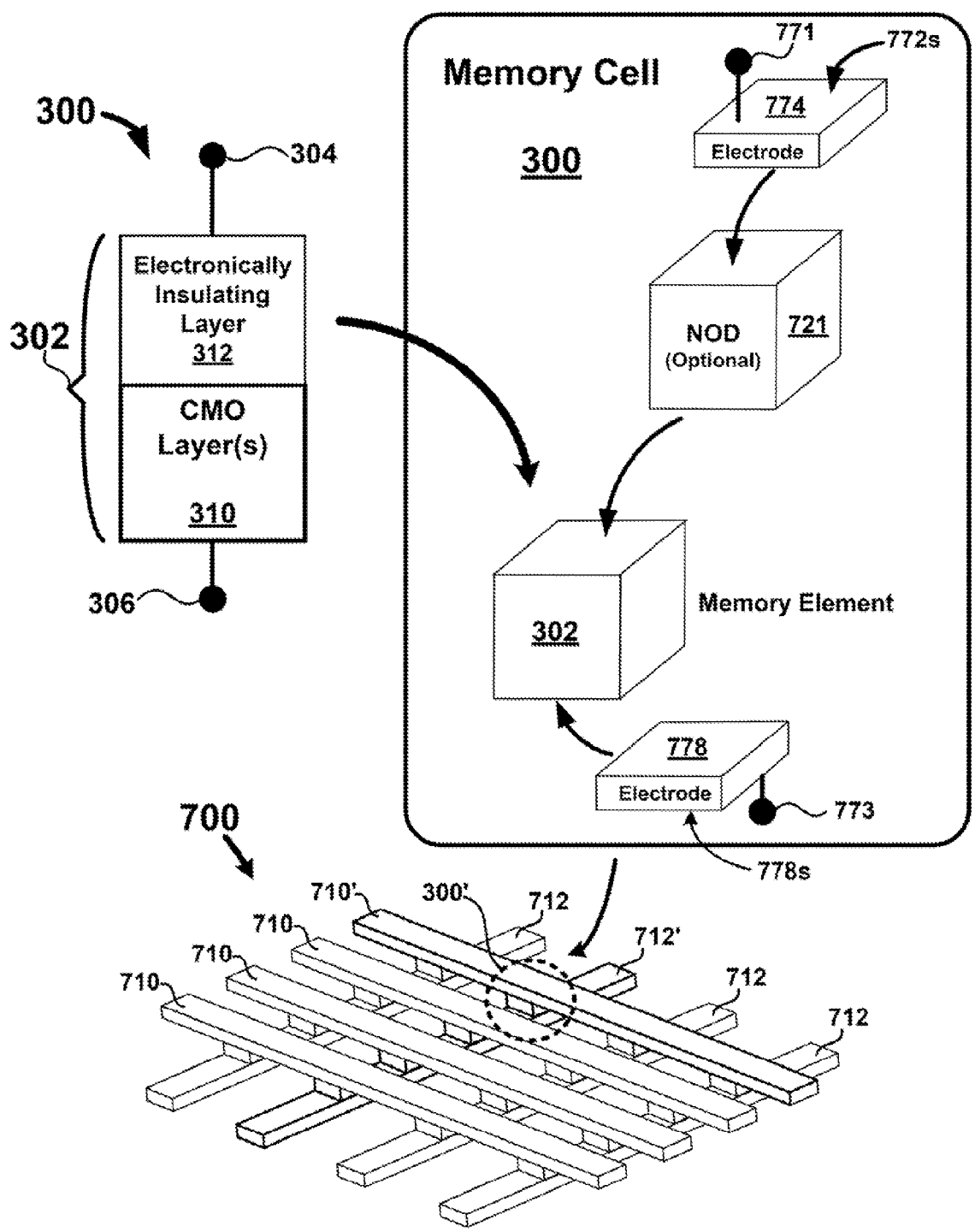
FIG. 7A depicts an example of memory cells positioned in a two-terminal cross-point array according to various embodiments of the invention.

Turning now to FIG. 7A depicts an example of arrayed memory cells according to various embodiments of the invention. Referring back to FIGS. 3G-3H above, a memory cell 300 includes the continuous CMO layer(s) 310, the layer 312 and additional layers such as electrodes 263 and 343 delineated by the dashed lines for memory cell 300. Collectively, the layers 310 and 312 can be referred to as a memory element 302 as those layers form the active portion of the memory cell 300 and are operative to store data as a plurality of conductivity profiles. For purposes of illustration and description, FIGS. 7A-9 do not show those portions of the layers 310 and 312 that are not within the dashed lines for memory cell 300 (e.g., the ion implanted IMO portions of layer(s) 310).

In the example of FIG. 7A, the memory cell 300 includes a memory element 302 and optionally a NOD 721 positioned above the memory element 302 or below (not shown) the memory element 302. The memory element 302 can include the above mentioned CMO layer(s) and electronically insulating layer denoted as 710 and 712 respectively. Memory cell 300 further includes terminals 771 and 773. Terminals 771 and 773 can be electrically coupled with or can be formed as electrodes 774 and 778. The electrodes (774, 778) can be made from an electrically conductive material including, but not limited to, platinum (Pt), gold (Au), silver (Ag), iridium (Ir), iridium oxide ($IrO_x$), ruthenium (Ru), palladium (Pd), aluminum (Al), alloys of those materials, and the like. The electrodes (774, 778) can be in contact with and/or electrically coupled with conductive array lines operative to apply the aforementioned voltages for data operations, such as read voltages and write voltages (e.g., program and erase voltages) across one or more selected memory cells 300. The memory element 302 and NOD 721 are electrically in series with each other and electrically in series with the electrodes (774, 778).

For example, electrode 774 can correspond to element 343 and electrode 778 can correspond to element 253 in FIGS. 3G-3H.

The NOD 721 is a device that substantially blocks current flow through the memory cell 300 when a voltage applied across the terminals (304, 306) or the array lines (710, 712) is not a voltage for a data operation such as a read voltage or a write voltage (e.g., a program or erase voltage). The NOD 721 has a non-linear I-V characteristic such that the current through the NOD 721 is not a linear function (e.g., Ohm's law) of to the voltage across the NOD 721. The non-linear I-V characteristic can be accomplished using materials configured for electron tunneling conduction such as thin film layers of a metal-insulator-metal (MIM) structure where there can be one or more thin film insulating layers sandwiched between a pair of electrically conductive materials (e.g., electrodes) such as the type of MIM devices disclosed in U.S. Pat. No. 7,995,371, issued Aug. 9, 2011 and titled "Threshold Device For A Memory Array", which is herein incorporated by reference for all purposes. The non-linear I-V characteristic can be accomplished using a semiconductor device such as a single Schottky diode or a pair of Schottky diodes arranged in a back-to-back configuration. Examples of Schottky diode NOD's are disclosed in U.S. Pat. No. 7,884,349, issued Feb. 8, 2011, and titled "Selection Device for Re-Writable Memory", which is herein incorporated by reference for all purposes.

Memory cell 300 can be formed between conductive array lines, such as array lines 712 and 710. Thus, memory cell 300 can be formed in an array of other memory cells 300. In FIG. 7A, array lines 712' and 710' are depicted in heavy line to illustrate that those array lines can have voltages for data operations applied to them such that memory cell 300' is the selected memory cell for a data operation (e.g., a read, program, or erase operation). The array can be the cross-point array 700 including groups of conductive array lines 710 and 712. For example, array lines 710 can be electrically coupled with the electrodes 774 of the memory cells 300 and/or may be in contact with a surface 772s of the electrodes 774, and array lines 712 can be electrically coupled with the electrodes 778 of the memory cells 300 and/or may be in contact with a surface 778s of the electrodes 778. Although not depicted in FIG. 7A, the active circuitry that applies the voltages for data operations is positioned below the array 700 on a substrate (e.g., a silicon Si wafer) upon which the active circuitry is fabricated front-end-of-the-line (FEOL) with the array 700 fabricated back-end-of-the-line (BEOL) directly on top of the FEOL active circuitry on the substrate and the array 700 in contact with the substrate as will be described in greater detail below in FIGS. 8A-9.

Figure 7B:
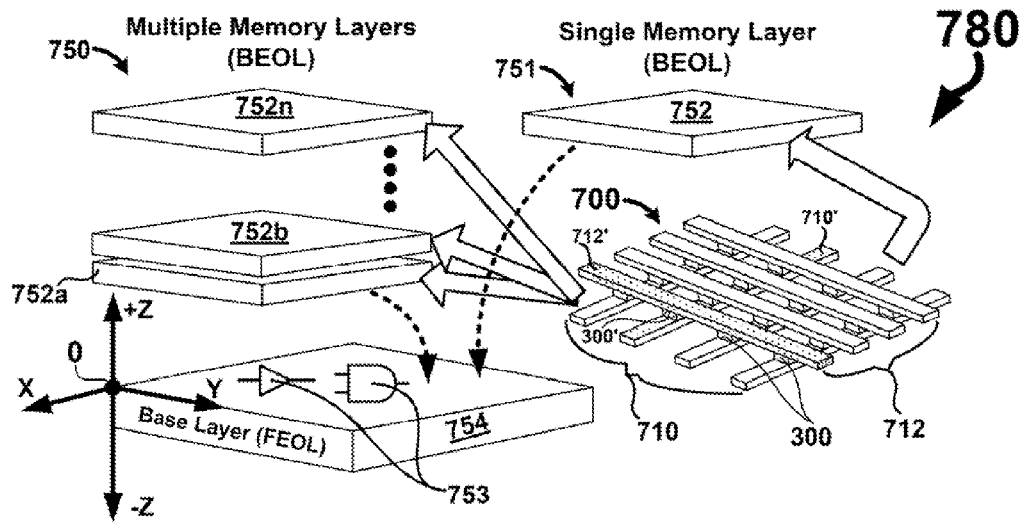
FIG. 7B depicts a single layer or multiple vertically stacked layers of memory arrays formed BEOL on top of a base layer including circuitry formed FEOL.

FIG. 7B depicts an integrated circuit including memory cells disposed in a single layer or in multiple layers of memory, according to various embodiments of the invention. In this example, integrated circuit 780 is shown to include either multiple layers 750 of memory (e.g., layers 752a, 752b, . . . 752n) or a single memory layer 751 (e.g., layer 752) formed on a base layer 754. As will be described in greater detail below, the layers 754 and 752a, 752b, . . . 752n or layers 754 and 752 are not physically separate layers as depicted in FIG. 7B for purposes of illustration, rather they are different portions of a unitary die 800 (not shown) comprised of a FEOL portion for the base layer 754 and a BEOL portion for the layer 752 or layers 752a, 752b, . . . 752n. In at least some embodiments, each layer (e.g., layer 752 or layers 752a, 752b, . . . 752n) of memory can be the cross-point memory array 700 including the conductive array lines 710 and 712 arranged in different directions to access re-writable memory cells 300 such as two-terminal memory cells as described above. Examples of conductive array lines include X-line conductive array lines (e.g., 710) and Y-line conductive array lines (e.g., 712). The X and Y conductive array lines are sometimes referred to as row lines and column lines respectively. Base layer 754 can include a bulk semiconductor substrate (e.g., a silicon wafer) upon which memory access circuits 753 (e.g., active circuitry) for performing data operations on the memory cells 300 in memory 750 or 751 are fabricated. Base layer 754 may include other circuitry that may or may not be related to data operations on memory. Base layer 754 and circuitry 753 (e.g., CMOS active circuitry such as decoders, drivers, sense amps, buffer, registers, etc.) can be formed in the FEOL fabrication process (e.g., along the −Z axis) and multiple memory layers 750 or single memory layer 751 can be formed in the BEOL fabrication process (e.g., along the +Z axis) that is tailored for fabricating layer(s) of memory arrays on top of the base layer 754. Although not depicted, the base layer 754 can include an inter-level interconnect structure configured to include electrically conductive nodes (e.g., openings in a dielectric material or electrically conductive structures such as vias, plugs, thrus, damascene structures, etc.) for facilitating electrical coupling between the circuitry 753 and the conductive array lines (710, 712) of the array(s) so that signals (e.g., read and write voltages) for data operations (e.g., read and write operations) are electrically communicated between the array(s) and the circuitry 753. The inter-level interconnect structure can be one of the last microelectronic structures fabricated during the FEOL processing.

Figure 7C:
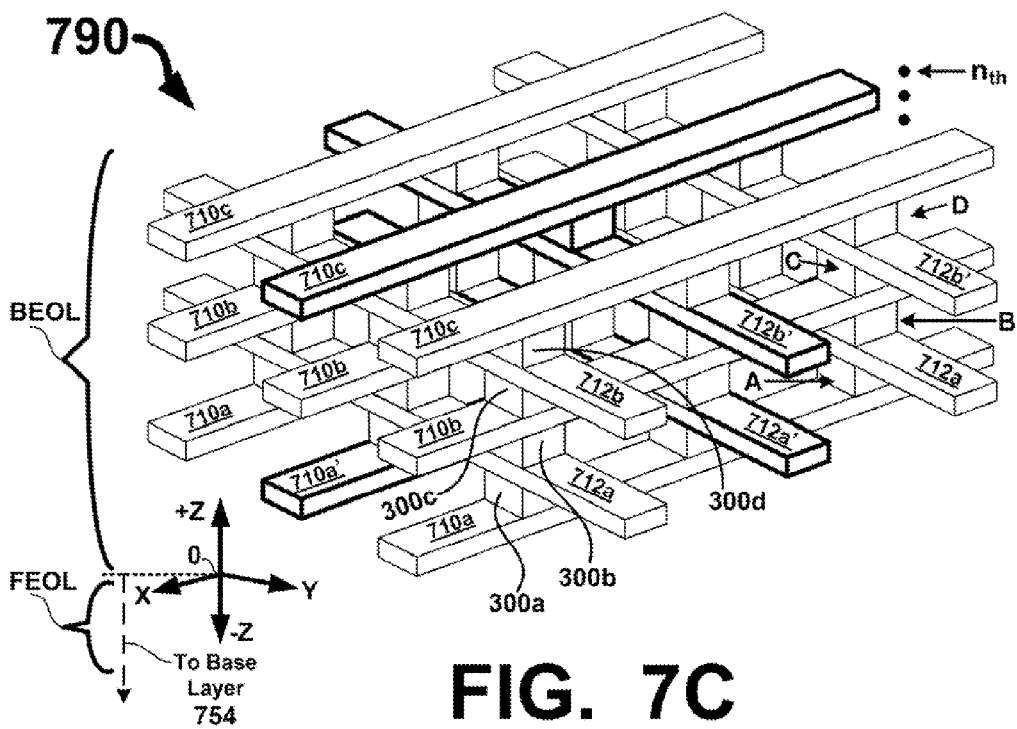
FIG. 7C depicts one example of a vertically stacked memory including multiple array layers that share conductive array lines and formed BEOL on top of a previously formed FEOL base layer.

Moving on to FIG. 7C, where a vertically stacked array 790 includes a plurality of memory layers A,B,C, and D with each memory layer including memory cells 300a, 300b, 300c, and 300d. Although only four layers are depicted, the array 790 can include fewer layers or can include additional layers up to an nth layer. The array 790 includes three levels of x-direction conductive array lines 710a, 710b, and 710c, and two levels of y-direction conductive array lines 712a, and 712b. Unlike the configuration for array 350 in FIG. 7A, the memory cells 300a, 300b, 300c, and 300d depicted in FIG. 7C share conductive array lines with other memory cells that are positioned above, below, or both above and below that memory cell. The conductive array lines, the memory cells, dielectric materials that electrically isolate structures in the array 790 (not shown), and other structures in the array 790 are formed BEOL above the base layer 754 (not shown) as indicated by +Z on the Z-axis above the dashed line at origin 0; whereas, the active circuitry for performing data operations on the array 790 and the interconnect structure for electrically coupling the active circuitry with the array 790 (e.g., the conductive array lines) are previously formed FEOL as indicated by −Z on the Z-axis below the dashed line at origin 0. Accordingly, the BEOL structure for array 790 is formed on top of the FEOL structure for base layer 754 with the order of fabrication going in a direction from −Z (i.e., FEOL) to +Z (i.e., BEOL) along the Z-axis.

Figure 8A:
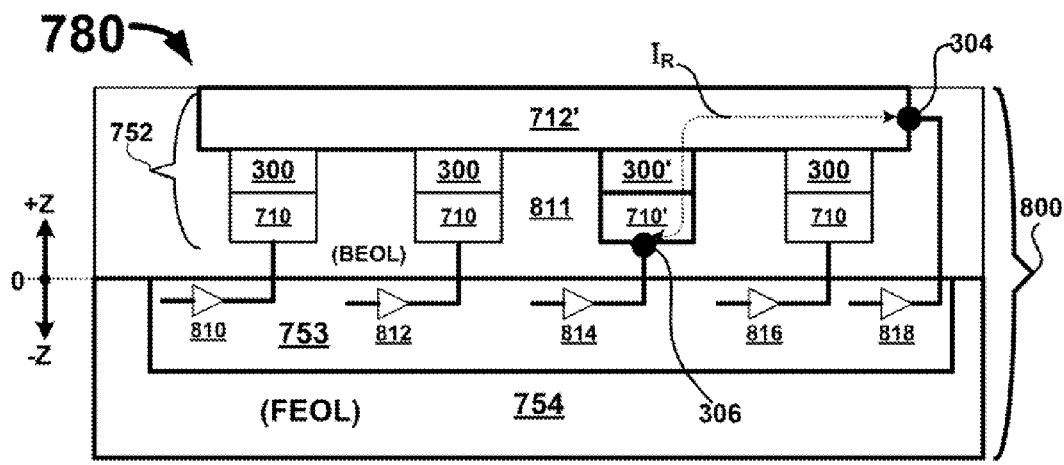
FIG. 8A depicts a cross-sectional view of an integrated circuit die including a single layer of memory fabricated over a substrate including active circuitry fabricated in a logic layer.

Reference is now made to FIG. 8A, where integrated circuit 780 includes the base layer 754 and active circuitry 753 fabricated on the base layer 754 (e.g., a silicon Si wafer). The integrated circuit 780 is comprised of a single unitary die 800 having a first portion (i.e., the base layer 754) fabricated first using FEOL processing and a second portion (i.e., the single memory layer 752) fabricated second and formed directly on top of the base layer 754 using BEOL processing, such that the second portion is integrally formed with the first portion and completes the formation of the die 800. As one example, the base layer 754 can be a silicon (Si) wafer and the active circuitry 753 can be microelectronic devices formed on the base layer 754 using a CMOS fabrication process. The memory cells 300 and their respective conductive array lines (710, 712) can be fabricated on top of the active circuitry 754 in the base layer 754. Those skilled in the art will appreciate that an inter-level interconnect structure (not shown) can electrically couple the conductive array lines (710, 712) with the active circuitry 753 which may include several metal layers. For example, vias can be used to electrically couple the conductive array lines (710, 712) with the active circuitry 753. The active circuitry 753 may include but is not limited to address decoders, sense amps, memory controllers, data buffers, direct memory access (DMA) circuits, voltage sources for generating the read and write voltages, just to name a few. Active circuits 810-818 can be configured to apply the select voltage potentials (e.g., read and write voltage potentials) to selected conductive array lines (310', 312'). Moreover, the active circuitry 753 may be electrically coupled with the conductive array lines (710', 712') to sense a read current $I_R$ that flows through selected memory cells 300' during a read operation and the read current $I_R$ can be sensed and processed by the active circuitry 753 to determine the conductivity profiles (e.g., the resistive state) of the selected memory cells 300'. Examples of conductivity profiles include but are not limited to a programmed conductivity profile written to a memory cell 300' during a programming data operation and an erased conductivity profile written to a memory cell 300' during an erase data operation. Memory cells 300 can store data as a plurality of conductivity profiles that can include the programmed or erased conductivity profiles only (e.g., only 1-Bit of data stored per memory cell 300) or more than two conductivity profiles for storing multiple bits of data per memory cell 300 (e.g., two or more bits of data per memory cell 300). The direction of current flow for the read current $I_R$ will depend on a magnitude and polarity of a read voltage applied across terminals 304 and 306. In some applications, it may be desirable to prevent un-selected array lines (710, 712) from floating. The active circuits 753 can be configured to apply an un-select voltage potential (e.g., approximately a ground potential) to the un-selected array lines (710, 712). A dielectric material 811 (e.g., $SiO_2$) may be used where necessary to provide electrical insulation between elements of the integrated circuit 780.

Figure 8B:
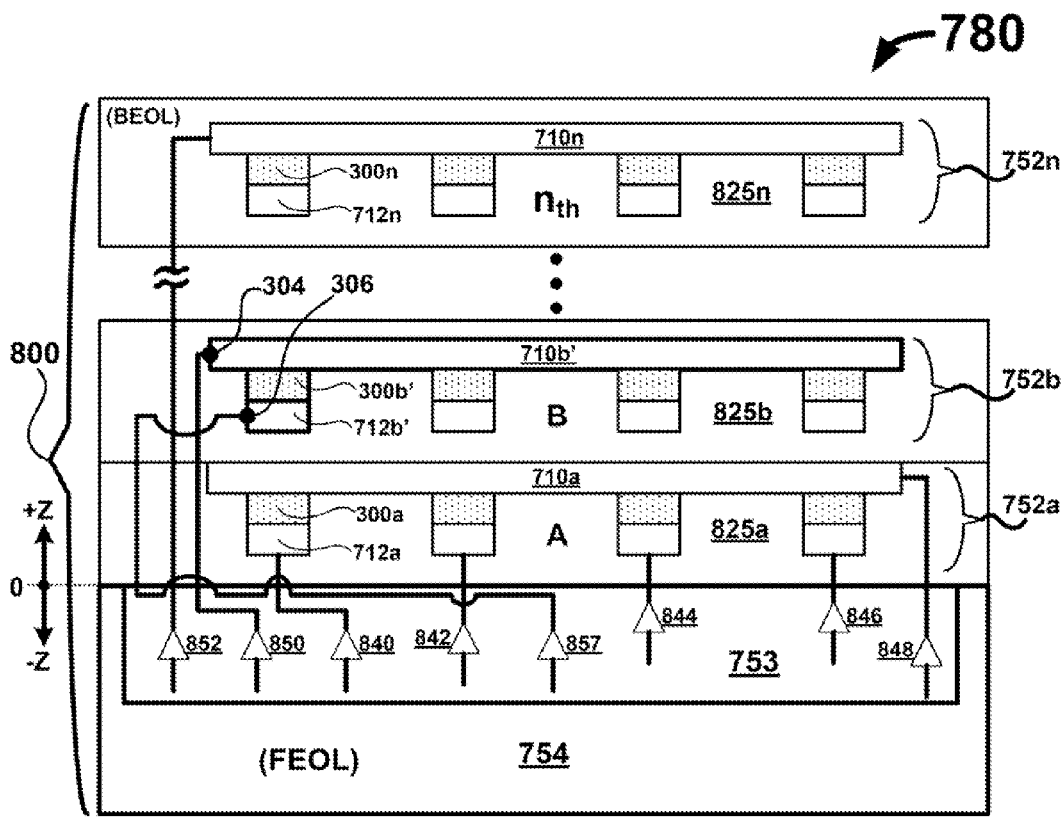
FIG. 8B depicts a cross-sectional view of an integrated circuit die including vertically stacked layers of memory fabricated over a substrate including active circuitry fabricated in a logic layer.

Moving now to FIG. 8B, an integrated circuit 780 includes a plurality of non-volatile memory arrays that are vertically stacked above one another (e.g., along a +Z axis) and are positioned above the base layer 754 that includes the active circuitry 753. The integrated circuit 780 includes vertically stacked memory layers A and B and may include additional memory layers up to an nth memory layer. The memory layers A, B, . . . through the nth layer can be electrically coupled with the active circuitry 753 in the base layer 754 by an inter-level interconnect structure as was described above. Layer A includes memory cells 300a and first and second conductive array lines (710a, 712a), Layer B includes memory cells 300b and first and second conductive array lines (710b, 712b), and if the nth layer is implemented, then the nth layer includes memory cells 300n and first and second conductive array lines (710n, 712n). Dielectric materials 825a, 825b, and 825n (e.g., $SiO_2$) may be used where necessary to provide electrical insulation between elements of the integrated circuit 820. Active circuits 840-857 can be configured to apply the select voltage potentials (e.g., read and write voltage potentials) to selected conductive array lines (e.g., 710a, b, . . . n, and 712a, b, . . . n). Driver circuits 850 and 857 are activated to select conductive array lines 710' and 712' to select memory cell 300b' for a data operation. As was described above, the active circuits 753 can be used to sense the read current $I_R$ (not shown) from selected memory cells 300b' during a read operation and can be configured to apply the un-select voltage potential to the un-selected array lines. As described above, the integrated circuit 780 comprises the die 800 that is a unitary whole comprised of a FEOL circuitry portion fabricated on base layer 754 and a BEOL memory portion having multiple memory layers that is in contact with the FEOL portion and is fabricated directly on top of the FEOL portion.

Figure 8C:
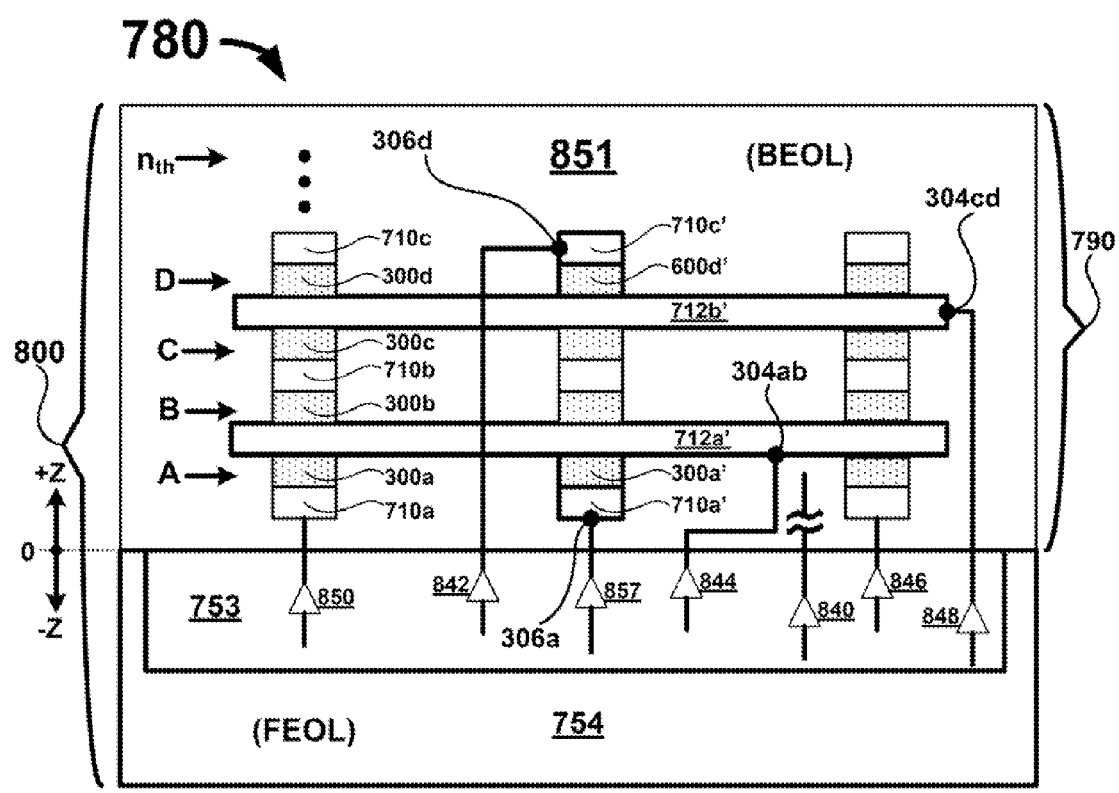
FIG. 8C depicts an integrated circuit die including vertically stacked layers of memory with shared conductive array lines fabricated over a substrate including active circuitry fabricated in a logic layer.

In FIG. 8C, an integrated circuit 780 includes base layer 754, active circuitry 753, and vertically staked memory layers A, B, C, and D that are fabricated above the base layer 754. Active circuits 840-857 are configured to perform data operations on the vertically staked memory layers A, B, C, and D. Driver circuits 844 and 857 are activated to select memory cell 300a' for a data operation and driver circuits 842 and 848 are activated to select memory cell 600d' for a data operation. A dielectric layer 851 is operative to electrically isolate the various components of integrated circuit 780. As described above, the integrated circuit 780 comprises the die 800 that is a unitary whole comprised of a FEOL circuitry portion fabricated on base layer 754 and a BEOL memory portion having multiple memory layers that is in contact with the FEOL portion and is fabricated directly on top of the FEOL portion.

Figure 9:
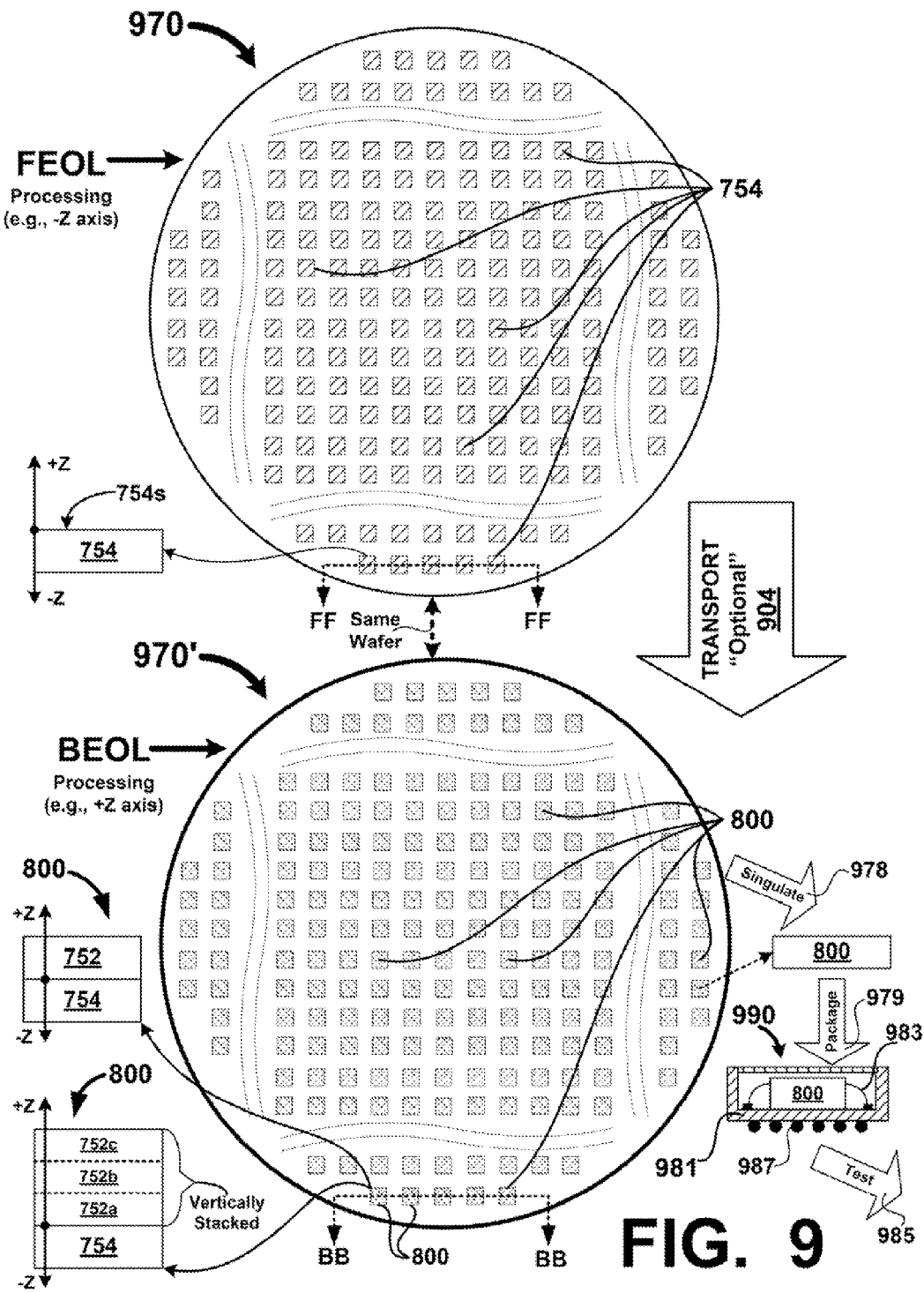
FIG. 9 is a top plan view depicting a transformation of a die as the die moves from FEOL processing where circuitry is fabricated on the die to BEOL processing where one or more layers of memory are fabricated directly on the die and above the FEOL fabricated circuitry.

Attention is now directed to FIG. 9, where the transformation of a FEOL processed wafer 970 to a subsequently BEOL processed wafer 970' is depicted. Here, the wafer 970 and 970' are the same wafer depicted at different stages of fabrication, where a first stage fabricates circuitry and an inter-level interconnect on wafer 970 and a second stage fabricates one or more layers of non-volatile memory array(s) directly on top of the FEOL wafer 970 includes a plurality of the aforementioned die 754. A cross-sectional view of the die 754 is depicted along a line FF-FF to illustrate that the base layer 754 is formed along the −Z axis and is not a finished die until the BEOL processing has fabricated the memory layer(s) on top of the base layer 754 along the +Z axis. After an optional transport 904, the FEOL wafer 970 is transformed into wafer 970' by BEOL processing to form completed die 800 that includes one layer of memory 752 or multiple layers of vertically stacked memory 752a, 752b, 752c . . . 752n, fabricated above base layer die 754 along the +Z axis as depicted in cross-sectional view along a line BB-BB. Upon completion of BEOL fabrication, wafer 970' can undergo additional fabrication steps such as singulating 978 (e.g., sawing) die 800 from the wafer 970', packaging 979 the singulated die 800 into packages 981, and testing 985 packaged die 990. Die 800 can be inserted into package 981 and wire bonded 983 or the like to electrically couple the die 800 with nodes 987 (e.g., pins, pads, solder bumps, etc.) on package 981. The die 800 can also be tested for yield and/or functionality prior to being singulated 978 from the wafer 970'. For example, prior to packaging 979, it may be desirable to test die 800 for functionality and yield of the memory layer(s) that were fabricated BEOL to determine which good functional die 800 to package 979. In some applications, the singulating, packaging, testing, or other processes can be part of the BEOL process and those processes can be accomplished by a BEOL fabricator, a BEOL fabrication facility, or by a BEOL third party. Similarly, prior to the optional transport 904, testing or other processes can be performed by a FEOL fabricator, a FEOL fabrication facility, or a FEOL third party.

Figure 9A:
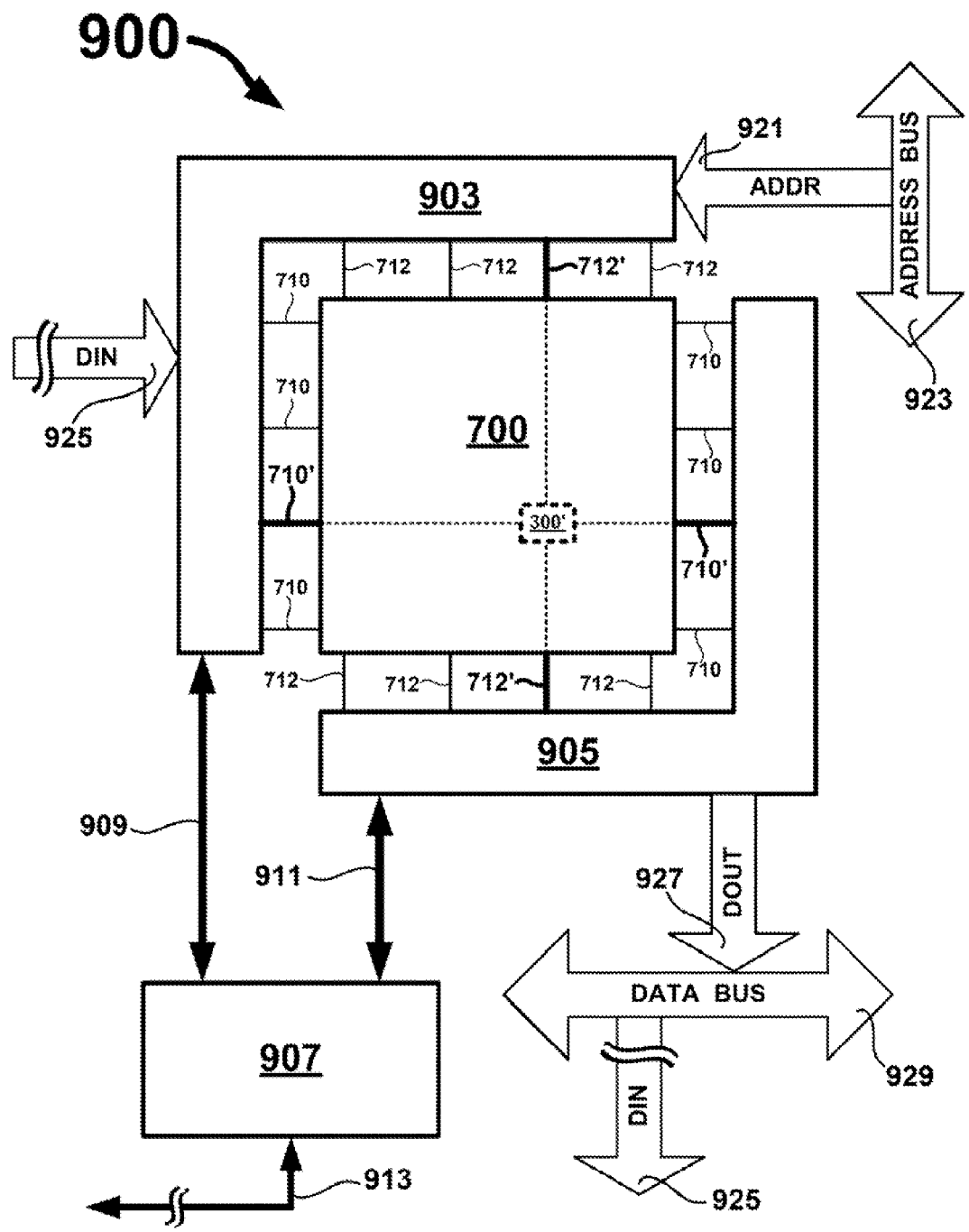
FIG. 9A depicts a memory system including a non-volatile two-terminal cross-point array.

Moving on to FIG. 9A, an exemplary memory system 900 includes the aforementioned non-volatile two-terminal cross-point memory array 700 (array 700 hereinafter) and the plurality of first conductive and second conductive traces denoted as 710 and 712, respectively. The memory system 900 also includes an address unit 903 and a sense unit 905.

The address unit 903 receives an address ADDR, decodes the address, and based on the address, selects at least one of the plurality of first conductive traces (denoted as 710') and one of the plurality of second conductive traces (denoted as 712'). The address unit 903 applies select voltage potentials (e.g., read or write voltages) to the selected first and second conductive traces 710' and 712'. The address unit 903 also applies a non-select voltage potential to unselected traces 710 and 712. The sense unit 905 senses one or more currents flowing through one or more of the conductive traces. During a read operation to the array 700, current sensed by the sense unit 905 is indicative of stored data in a memory cell 300' positioned at an intersection of the selected first and second conductive traces 710' and 712'. A bus 921 coupled with an address bus 923 can be used to communicate the address ADDR to the address unit 903. The sense unit 905 processes the one or more currents and at least one additional signal to generate a data signal DOUT that is indicative of the stored data in the memory cell. In some embodiments, the sense unit 905 may sense current flowing through a plurality of memory cells and processes those currents along with additional signals to generate a data signal DOUT for each of the plurality of memory cells. A bus 927 communicates the data signal DOUT to a data bus 929. During a write operation to the array 700, the address unit 903 receives write data DIN to be written to a memory cell specified by the address ADDR. A bus 925 communicates the write data DIN from the data bus 929 to the address unit 903. The address unit 903 determines a magnitude and polarity of the select voltage potentials to be applied to the selected first and second conductive traces 710' and 712' based on the value of the write data DIN. For example, one magnitude and polarity can be used to write a logic "0" and a second magnitude and polarity can be used to write a logic "1". In other embodiments, the memory system 900 can include dedicated circuitry that is separate from the address unit 903 to generate the select potentials and to determine the magnitude and polarity of the select potentials.

One skilled in the art will appreciate that the memory system 900 and its components (e.g., 903 and 905) can be electrically coupled with and controlled by an external system or device (e.g., a microprocessor or a memory controller). Optionally, the memory system 900 can include at least one control unit 907 operative to coordinate and control operation of the address and sense units 903 and 905 and any other circuitry necessary for data operations (e.g., read and write operations) to the array 350. Although only one array 700 is depicted, the array 700 can comprise a single layer of memory (e.g., 752) or multiple layers of vertically stacked memory (752a, 752b, . . . 752n) as depicted in FIGS. 7A-8C. One or more signal lines 909 and 911 can electrically couple the control unit 907 with the address and sense units 903 and 905. The control unit 907 can be electrically coupled with an external system (e.g., a microprocessor or a memory controller) through one or more signal lines 913.

As was described above in reference to FIGS. 7A through 8C, one or more of the arrays 700 can be positioned over a substrate 754 that includes active circuitry 753 and the active circuitry 753 can be electrically coupled with the array(s) 700 using an interconnect structure that couples signals from the active circuitry 753 with the conductive array lines 710 and 712. In FIG. 9A, the busses, signal lines, control signals, the address, sense, and control units 903, 905, and 907 can comprise the active circuitry 753 and its related interconnect, and can be fabricated on the substrate 754 (e.g., a silicon wafer) using a microelectronics fabrication technology, such as CMOS, for example.

Figure 10:
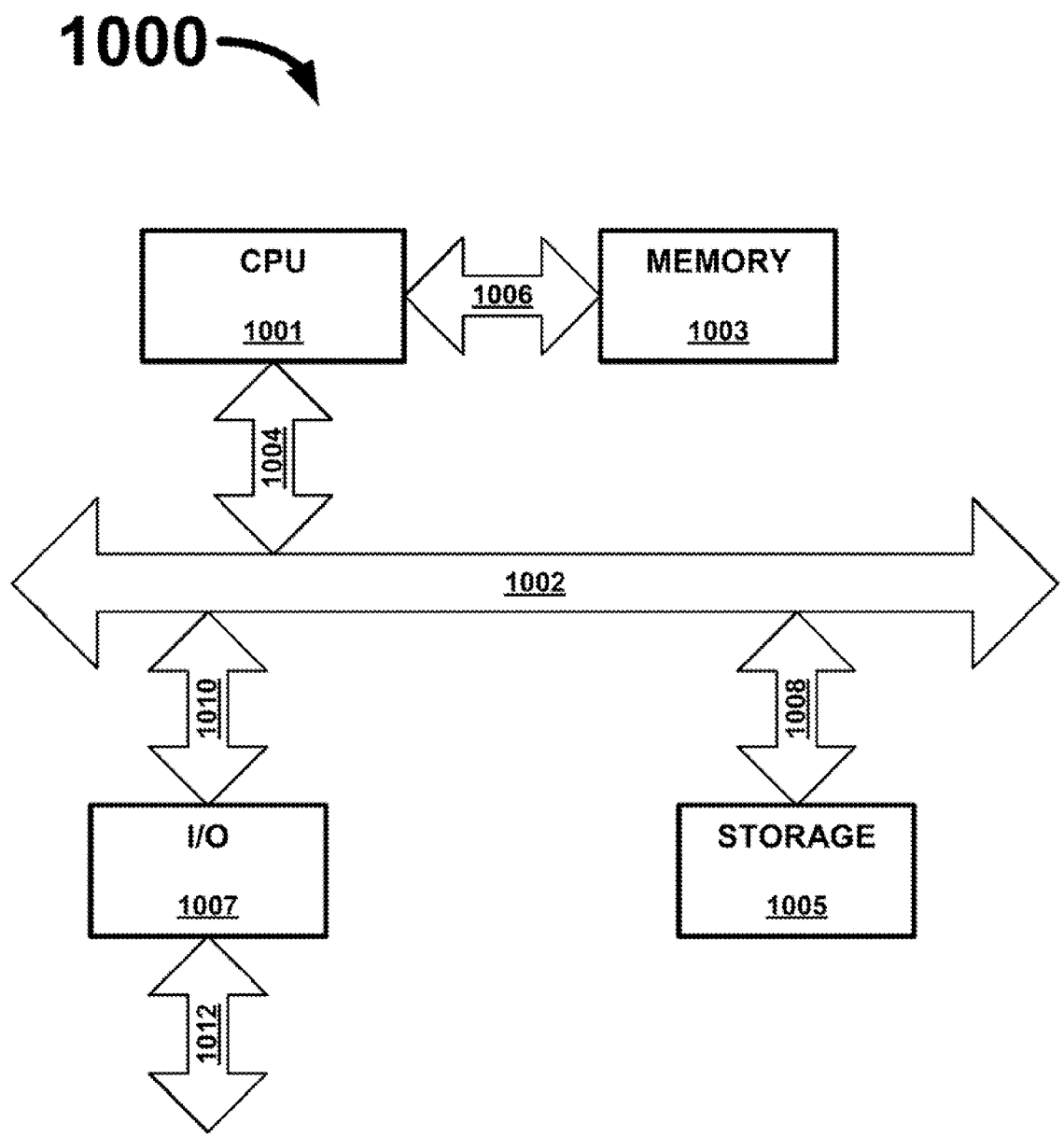
FIG. 10 depicts an exemplary electrical system that includes at least one non-volatile two-terminal cross-point array.

Reference is now made to FIG. 10, where an electrical system 1000 includes a CPU 1001 that is electrically coupled 1004 with a bus 1002, an I/O unit 1007 that is electrically coupled 1010 with the bus 1002, and a storage unit 1005 that is electrically coupled 1008 with the bus 1002. The I/O unit 1007 is electrically coupled 1012 to external sources (not shown) of input data and output data. The CPU 1001 can be any type of processing unit including but not limited to a microprocessor (μP), a micro-controller (μC), a digital signal processor (DSP), or some other type of host or system that utilizes or communicates with non-volatile data storage, for example. Via the bus 1002, the CPU 1001, and optionally the I/O unit 1007, performs data operations (e.g., reading and writing data) on the storage unit 1005. The storage unit 1005 stores at least a portion of the data in the aforementioned non-volatile two-terminal cross-point array as depicted in FIGS. 7A through 9A. Each memory array includes a plurality of the two-terminal memory cells 300. The configuration of the storage unit 1005 will be application specific. Example configurations include but are not limited to one or more single layer non-volatile two-terminal cross-point arrays (e.g., 752) and one or more vertically stacked non-volatile two-terminal cross-point arrays (e.g., 752a-752n). In the electrical system 1000, data stored in the storage unit 1005 is retained in the absence of electrical power. The CPU 1001 may include a memory controller (not shown) for controlling data operations to the storage unit 1005.

Alternatively, the electrical system 1000 may include the CPU 1001 and the I/O unit 1007 coupled with the bus 1002, and a memory unit 1003 that is directly coupled 1006 with the CPU 1001. The memory unit 1003 is configured to serve some or all of the memory needs of the CPU 1001. The CPU 1001, and optionally the I/O unit 1007, executes data operations (e.g., reading and writing data) to the non-volatile memory unit 1003. The memory unit 1003 stores at least a portion of the data in the aforementioned non-volatile two-terminal cross-point array as depicted in FIGS. 7A through 9A. Each memory array can include a plurality of the two-terminal memory cells 300 with each memory cell 300 including the two-terminal memory element 302 and the optional NOD 721. The configuration of the memory unit 1003 will be application specific. Example configurations include but are not limited to one or more single layer non-volatile two-terminal cross-point arrays (e.g., 752) and one or more vertically stacked non-volatile two-terminal cross-point arrays (e.g., 752a-752n). In the electrical system 1000, data stored in the memory unit 1003 is retained in the absence of electrical power. Data and program instructions for use by the CPU 1001 may be stored in the memory unit 1003. The CPU 1001 may include a memory controller (not shown) for controlling data operations to the non-volatile memory unit 1003. The memory controller may be configured for direct memory access (DMA).

In the exampled depicted in FIG. 10, the memory 1003 and/or storage 1005 can include the aforementioned non-volatile two-terminal cross-point array as depicted in FIGS. 7A through 9A and can be configured to emulate one or more memory types and/or data storage devices including but not limited to DRAM, SRAM, FLASH, ROM, hard disk drives (HD), hybrid hard disk drives (HHD), solid state disk drives (SSD), redundant array of inexpensive disks (RAID) storage drives, and mobile storage using embedded storage devices such as embedded MMC (eMMC), embedded secure digital (eSD), and universal flash storage (UFS). Signals electrically communicated over 1002, 1004, 1006, 1008, 1010, and 1012 can include signals for storage-interfaces including but not limited to serial ATA (e.g., SATA or eSATA), PCI Express (e.g., PCIe or PCI-e), and universal serial bus (USB), IEEE-1394 (e.g., FireWire), or some other interface protocol.

As one example, storage 1005 can use the non-volatile two-terminal cross-point array(s) depicted in FIGS. 7A through 9A configured to operate as a SSD where the non-volatile two-terminal cross-point array(s) replace conventional FLASH memory chips. Storage 1005 may include along with one or more of the IC's 981 a separate memory controller IC electrically coupled with the IC's 981 and operative to perform data operations in response from commands from CPU 1001 or some other host or system communicating with Storage 1005 via bus 1002. In some applications, the memory controller IC can be eliminated, and in other applications the memory controller can be fabricated in the base layer 754 of one or more of the IC's 981.

The foregoing examples have been described in some detail for purposes of clarity of understanding, but are not limited to the details provided. There are many alternative ways and techniques for implementation. The disclosed examples are illustrative and not intended to be restrictive to the examples and details provided.

What is claimed is:

1. A re-writeable non-volatile two-terminal memory device, comprising:
   a re-writeable non-volatile two-terminal memory element including electrically in series with a first electrode and a second electrode,
     a layer of electronically insulating material having a first thickness that is approximately 50 Angstroms or less, the layer of electronically insulating material is in contact with the second electrode,
     a plurality of continuous layers of conductive metal oxide (CMO) that are in contact with one another, only one of the plurality of continuous layers of CMO is in contact with the first electrode, at least one layer of the plurality of continuous layers of CMO includes mobile oxygen ions and at least a portion of the mobile oxygen ions are transported between the at least one layer and the layer of electronically insulating material when a write voltage is applied across the first and second electrodes, one or more of the plurality of continuous layers of CMO configured to store at least one-bit of non-volatile data as a plurality of conductivity profiles that are retained in the absence of electrical power, are reversibly written by applying the write voltage, and are read by applying a read voltage across the first and second electrodes,
   a first portion of the plurality of continuous layers of CMO positioned between the first and second electrodes comprises electrically conductive CMO layers, and a second portion of the plurality of continuous layers of CMO not positioned between the first and second electrodes comprises ion implanted and electrically non-conductive insulating metal oxide (IMO) regions.

2. The memory device of claim 1 and further comprising:
   a plurality of the re-writeable non-volatile two-terminal memory elements configured in a cross-point array where each memory element is positioned between a unique pair of a plurality of conductive array lines of a two-terminal cross-point array and the first and second electrodes are directly electrically coupled with and electrically in series with its respective unique pair of conductive array lines, and
   the ion implanted and electrically non-conductive IMO regions are operative to electrically isolate the plurality of the re-writeable non-volatile two-terminal memory elements from one another.

3. The memory device of claim 2 and further comprising:
a semiconductor substrate having a front-end-of-the-line (FEOL) circuitry portion including active circuitry fabricated on the FEOL circuitry portion and a back-end-of-the-line (BEOL) memory portion that is fabricated directly above and in contact with the FEOL circuitry portion such that the BEOL memory portion and the FEOL circuitry portion are an integrally formed unitary whole,
the BEOL memory portion including at least one memory layer including at least one of the two-terminal cross-point arrays, the plurality of conductive array lines of each two-terminal cross-point array are electrically coupled with at least a portion of the active circuitry.

4. The memory device of claim 3, wherein the semiconductor substrate comprises a die.

5. The memory device of claim 1, wherein the layer of electronically insulating material comprises a material selected from the group consisting of a rare earth oxide, a rare earth metal oxide, zirconium oxide, yttrium oxide, erbium oxide, gadolinium oxide, lanthanum aluminum oxide, hafnium oxide, and yttria-stabilized zirconia (YSZ).

6. The memory device of claim 1, wherein the layer of electronically insulating material comprises an atomic layer deposition (ALD) deposited layer of material.

7. The memory device of claim 1, wherein one or more of the plurality of continuous layers of CMO comprises a layer of material deposited in whole or in part using atomic layer deposition (ALD).

8. The memory device of claim 7, wherein the CMO layer that is in direct contact with the first electrode has a second thickness that is less than about 20 Angstroms.

9. The memory device of claim 1, wherein the second portion of the plurality of continuous layers of CMO have an amorphous structure.

10. The memory device of claim 1, wherein the second portion of the plurality of continuous layers of CMO have a crystalline structure.

11. The memory device of claim 1, wherein the first portion of the plurality of continuous layers of CMO have an amorphous structure.

12. The memory device of claim 1, wherein the first portion of the plurality of continuous layers of CMO have a crystalline structure.

13. The memory device of claim 12, wherein an ion species implanted in the reactive ion implanted regions is selected from the group consisting of aluminum, zirconium, titanium, silicon, oxygen, and silicon and oxygen.

14. The memory device of claim 13, wherein a first layer of the two layers is the layer that is in contact with the first electrode and a second layer of the two layers is in contact with the layer of electronically insulating material and the first layer is substantially thinner than the second layer.

15. The memory device of claim 13, wherein a first layer of the two layers is the layer that is in contact with the first electrode and a second layer of the two layers is in contact with the layer of electronically insulating material and the first layer is substantially thicker than the second layer.

16. The memory device of claim 1, wherein the second portion of the plurality of continuous layers of CMO is ion implanted with at least two different species of ion.

17. The memory device of claim 1, wherein the ion implanted and electrically non-conductive insulating metal oxide (IMO) regions comprise reactive ion implanted regions.

18. The memory device of claim 1, wherein the ion implanted and electrically non-conductive insulating metal oxide (IMO) regions are implanted with an ion species selected from the group consisting of argon and xenon.

19. The memory device of claim 1, wherein the plurality of continuous layers of CMO comprises exactly two layers.

20. The memory device of claim 1, wherein the plurality of continuous layers of CMO comprises exactly three layers.

21. The memory device of claim 1, wherein at least two of the plurality of continuous layers of CMO are made from different CMO materials.

22. The memory device of claim 1, wherein at least two of the plurality of continuous layers of CMO have different thickness.

23. The memory device of claim 1, wherein at least one of the plurality of continuous layers of CMO comprises a perovskite material and an A-site of the perovskite material comprises one or more elements selected from the group consisting of the lanthanide series, strontium, barium, and calcium, and wherein a B-site of the perovskite material comprises one or more elements selected from the group consisting of copper, iron, nickel, manganese, cobalt, and chromium.

24. The memory device of claim 1, wherein the layer of electronically insulating material comprises a continuous layer.

25. The memory device of claim 1, wherein the layer of electronically insulating material is an electrolyte that is permeable to the mobile oxygen ions when the write voltage is applied and the first thickness is specifically configured for electron tunneling through the layer of electronically insulating material during data operations to the memory element.

* * * * *